United States Patent
Uchida et al.

(10) Patent No.: US 9,577,044 B2
(45) Date of Patent: Feb. 21, 2017

(54) SEMICONDUCTOR DEVICE WITH FIRST AND SECOND ELECTRODES FORMING SCHOTTKY JUNCTION WITH SILICON CARBIDE SEMICONDUCTOR LAYER AND METHOD OF MANUFACTURING THE SAME

(71) Applicant: Panasonic Intellectual Property Management Co., Ltd., Osaka (JP)

(72) Inventors: Masao Uchida, Osaka (JP); Masashi Hayashi, Osaka (JP); Koutarou Tanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/632,895

(22) Filed: Feb. 26, 2015

(65) Prior Publication Data
US 2015/0255544 A1    Sep. 10, 2015

(30) Foreign Application Priority Data

Mar. 10, 2014    (JP) ................................ 2014-045885

(51) Int. Cl.
*H01L 29/15*    (2006.01)
*H01L 29/16*    (2006.01)
(Continued)

(52) U.S. Cl.
CPC ....... *H01L 29/1608* (2013.01); *H01L 21/0485* (2013.01); *H01L 21/0495* (2013.01);
(Continued)

(58) Field of Classification Search
CPC .............. H01L 29/0603; H01L 29/0611; H01L 29/0619; H01L 29/0626; H01L 29/063; H01L 29/105; H01L 29/1066; H01L 29/2003; H01L 29/66068; H01L 29/872; H01L 29/1608; H01L 29/66143; H01L 29/861; H01L 29/47; H01L 21/02529; H01L 29/7787; H01L 21/0495
(Continued)

(56) References Cited

U.S. PATENT DOCUMENTS 5,278,443 A * 1/1994 Mori ....................... H01L 24/05
                                                        257/475
6,683,347 B1 * 1/2004 Fujihira .............. H01L 29/0619
                                                        257/339
(Continued)

FOREIGN PATENT DOCUMENTS

JP    62-193280    8/1987
JP    1-270348     10/1989
(Continued)

*Primary Examiner* — Thomas L Dickey
*Assistant Examiner* — Herve Assouman
(74) *Attorney, Agent, or Firm* — McDermott Will & Emery LLP

(57) ABSTRACT

A semiconductor device includes first and second second-conductivity-type region groups containing multiple second-conductivity-type regions that are disposed on a first silicon carbide semiconductor layer of a first conductivity type, arrayed in parallel following one direction with a space between each other, and first and second electrodes disposed on the first silicon carbide semiconductor layer and forming a Schottky junction with the first silicon carbide semiconductor layer. The first electrode covers a position where a distance from adjacent first and second second-conductivity-type regions included in a first second-conductivity-type region group, and a distance from a third second-conductivity-type region included in a second second-conductivity-type region group and adjacent to the first and second second-conductivity-type regions, are equal. A Schottky barrier between the first electrode and the first silicon carbide semiconductor layer is larger than a Schottky barrier
(Continued)

between the second electrode and the first silicon carbide semiconductor layer.

17 Claims, 32 Drawing Sheets

(51) Int. Cl.
*H01L 29/66* (2006.01)
*H01L 29/872* (2006.01)
*H01L 29/47* (2006.01)
*H01L 21/04* (2006.01)
*H01L 29/06* (2006.01)
*H01L 29/78* (2006.01)
*H01L 29/45* (2006.01)
*H01L 29/423* (2006.01)

(52) U.S. Cl.
CPC ...... *H01L 29/0619* (2013.01); *H01L 29/0692* (2013.01); *H01L 29/47* (2013.01); *H01L 29/6606* (2013.01); *H01L 29/66068* (2013.01); *H01L 29/7806* (2013.01); *H01L 29/7811* (2013.01); *H01L 29/7828* (2013.01); *H01L 29/872* (2013.01); *H01L 29/423* (2013.01); *H01L 29/45* (2013.01)

(58) Field of Classification Search
USPC ....... 438/521, 523, 534, 572, 167, 173, 186; 257/76, 472, 492, 504, 550, 611, 609, 287, 257/256, 135, 263, 267, 28, E29.008, 48–496, 257/E29.222, E29.007, E29.012, E29.013, 257/E29.014, E29.009, 481, 483, 605, 77

See application file for complete search history.

(56) References Cited

U.S. PATENT DOCUMENTS

| | | | |
|---|---|---|---|
| 2005/0194610 A1* | 9/2005 | Souma | H01L 29/66143 257/133 |
| 2008/0121993 A1* | 5/2008 | Hefner | H01L 21/0465 257/341 |
| 2008/0277668 A1* | 11/2008 | Okuno | H01L 29/0692 257/77 |
| 2013/0062723 A1* | 3/2013 | Henning | H01L 29/8611 257/484 |

FOREIGN PATENT DOCUMENTS

| | | |
|---|---|---|
| JP | 11-243215 | 9/1999 |
| JP | 2000-022178 | 1/2000 |
| JP | 2005-243715 | 9/2005 |
| JP | 2006-524432 | 10/2006 |
| JP | 2007-324218 | 12/2007 |
| JP | 2010-135646 | 6/2010 |
| JP | 2012-124268 | 6/2012 |
| WO | 2004/097944 | 11/2004 |

* cited by examiner

SEMICONDUCTOR DEVICE WITH FIRST AND SECOND ELECTRODES FORMING SCHOTTKY JUNCTION WITH SILICON CARBIDE SEMICONDUCTOR LAYER AND METHOD OF MANUFACTURING THE SAME

BACKGROUND

1. Technical Field

The present disclosure relates to a semiconductor device and a manufacturing method thereof, and more particularly relates to a semiconductor device containing silicon carbide and a manufacturing method thereof.

2. Description of the Related Art

Silicon carbide (SiC) is a semiconductor material which has a larger band gap as compared to silicon (Si) and which has a high degree of hardness. SiC has been applied to power devices such as switching devices and rectifying devices, for example. Power devices using SiC have an advantage that power less can be reduced, for example, in comparison with power devices using Si.

The metal-insulator-semiconductor field-effect transistor (MISFET) and the Schottky-barrier diode (SBD) are representative of semiconductor devices using SiC. The metal-oxide-semiconductor field-effect transistor (MOSFET) is a type of MISFET. The junction-barrier Schottky diode (JBS) is a type of SBD.

A JBS has a first conductivity type semiconductor layer, multiple second-conductivity-type regions disposed in contact with the first conductivity type semiconductor layer, and a Schottky electrode which forms a Schottky junction with the first conductivity type semiconductor layer and the multiple second-conductivity-type regions. The JBS exhibits lower leak current when reverse bias is applied to the JBS as compared to the SBD, due to the multiple second-conductivity-type regions.

Japanese Unexamined Patent Application Publication No. 2005-243715, for example, discloses that leak current when reverse bias is applied to the JBS is even further reduced by forming a Schottky electrode disposed above the first-conductivity-type semiconductor layer and a Schottky electrode disposed above the multiple second-conductivity-type regions from different metals.

Japanese Unexamined Patent Application Publication No. 2005-243715 discloses a JBS having a first Schottky electrode disposed above the first-conductivity-type semiconductor layer excluding portions of the first-conductivity-type semiconductor layer which are at the perimeter of the second-conductivity-type regions, and a second Schottky electrode disposed above the second-conductivity-type regions and portions of the first-conductivity-type semiconductor layer which are at the perimeter of the second-conductivity-type regions.

A metal having a large work function is used for the first Schottky electrode, and a metal having a small work function is used for the second Schottky electrode. Due to this configuration, leak current when reverse bias is applied to the JBS is further reduced as compared to a configuration where both the first-conductivity-type semiconductor layer and the second-conductivity-type regions are both covered by the second Schottky electrode.

SUMMARY

However, the JBS according to Japanese Unexamined Patent Application Publication No. 2005-243715 has had large onset voltage regarding the forward current of the diode, since the entire first-conductivity-type semiconductor layer except for portions at the perimeter of the second-conductivity-type regions is covered by the first Schottky electrode formed of the metal with a large work function.

One non-limiting and exemplary embodiment provides a semiconductor device and a manufacturing method thereof which realize improved forward current characteristics and reduced leak current in the inverse direction.

In one general aspect, the techniques disclosed here feature a semiconductor device including: a semiconductor substrate of a first conductivity type, having a principal surface; a first silicon carbide semiconductor layer of the first conductivity type, disposed on the principal surface of the semiconductor substrate; a plurality of second-conductivity-type region groups each containing a plurality of second-conductivity-type regions, disposed in the first silicon carbide semiconductor layer; a first electrode that is disposed on the first silicon carbide semiconductor layer and forms a Schottky junction with the first silicon carbide semiconductor layer; a second electrode that is disposed on the first silicon carbide semiconductor layer and is electrically connected with the first electrode, and that forms a Schottky junction with the first silicon carbide semiconductor layer; and a third electrode disposed on a rear surface of the semiconductor substrate. The plurality of second-conductivity-type region groups include a first second-conductivity-type region group containing a plurality of second-conductivity-type regions that are arrayed following one direction with a space between each other, when viewed from a direction perpendicular to the principal surface of the semiconductor substrate, and a second second-conductivity-type region group containing a plurality of second-conductivity-type regions that are arrayed following the one direction with the space between each other, when viewed from the direction perpendicular to the principal surface of the semiconductor substrate. The second second-conductivity-type region group is disposed in parallel with the first second-conductivity-type region group. The second electrode covers a first portion which is at least a portion of the first silicon carbide semiconductor layer between two of the second-conductivity-type regions that are adjacent and included in the first second-conductivity-type region group and the second second-conductivity-type region group, the portion being in contact with each of the two adjacent second-conductivity-type regions. One of the two adjacent second-conductivity-type regions included in the first second-conductivity-type region group is defined as a first second-conductivity-type region and the other of the two adjacent second-conductivity-type regions included in the first second-conductivity-type region group is defined as a second second-conductivity-type region. The second-conductivity-type regions included in the second second-conductivity-type region group and adjacent to the first second-conductivity-type region and the second second-conductivity-type region is defined as a third second-conductivity-type region. The first electrode covers, of the first silicon carbide semiconductor layer in a region surrounded by the first second-conductivity-type region, the second second-conductivity-type region, and the third second-conductivity-type region, a position where a distance from the first second-conductivity-type region, a distance from the second second-conductivity-type region, and a distance from the third second-conductivity-type region are mutually equal. A Schottky barrier between the first electrode and the first silicon carbide semiconductor layer is larger than a Schottky barrier between the second electrode and the first silicon carbide semiconductor layer.

It should be noted that general or specific embodiments may be implemented as a system, a method, an integrated circuit, a computer program, a storage medium, or any selective combination thereof.

According to the semiconductor device and a manufacturing method thereof disclosed in the present specification, a semiconductor device and a manufacturing method thereof are provided which realize improved forward current characteristics and reduced leak current in the inverse direction. Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
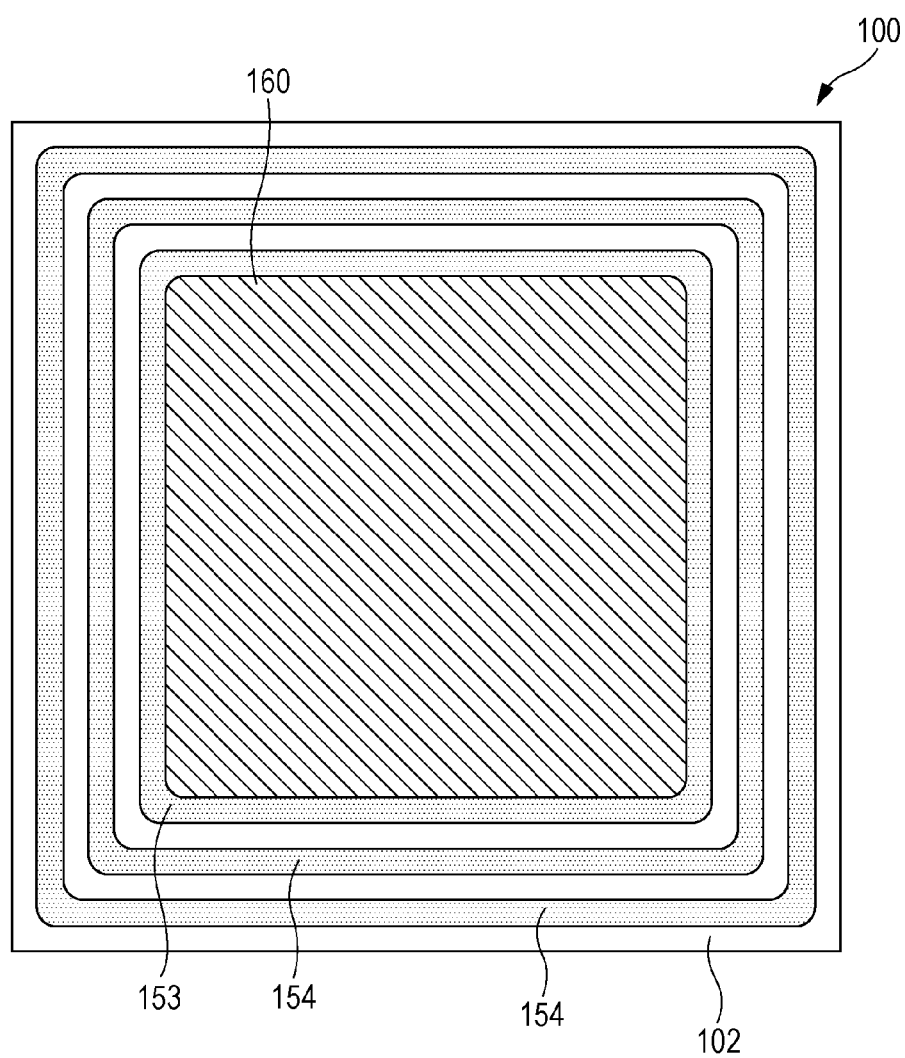
FIG. 1 is a plan view illustrating an overview of a semiconductor device according to a first embodiment of the present disclosure.

A semiconductor device according to an aspect of the present disclosure includes: a semiconductor substrate of a first conductivity type, having a principal surface; a first silicon carbide semiconductor layer of the first conductivity type, disposed on the principal surface of the semiconductor substrate; a plurality of second-conductivity-type region groups each containing a plurality of second-conductivity-type regions, disposed in the first silicon carbide semiconductor layer; a first electrode that is disposed on the first silicon carbide semiconductor layer and forms a Schottky junction with the first silicon carbide semiconductor layer; a second electrode that is disposed on the first silicon carbide semiconductor layer and is electrically connected with the first electrode, and that forms a Schottky junction with the first silicon carbide semiconductor layer; and a third electrode disposed on a rear surface of the semiconductor substrate. The plurality of second-conductivity-type region groups include a first second-conductivity-type region group containing a plurality of second-conductivity-type regions that are arrayed following one direction with a space (hereinafter, "space S") between each other, when viewed from a direction perpendicular to the principal surface of the semiconductor substrate, and a second second-conductivity-type region group containing a plurality of second-conductivity-type regions that are arrayed following the one direction with the space S between each other, when viewed from the direction perpendicular to the principal surface of the semiconductor substrate. The second second-conductivity-type region group is disposed in parallel with the first second-conductivity-type region group. The second electrode covers a first portion which is at least a portion of the first silicon carbide semiconductor layer between two of the second-conductivity-type regions that are adjacent and included in the first second-conductivity-type region group and the second second-conductivity-type region group, the portion being in contact with each of the two adjacent second-conductivity-type regions. One of the two adjacent second-conductivity-type regions included in the first second-conductivity-type region group is defined as a first second-conductivity-type region and the other of the two adjacent second-conductivity-type regions included in the first second-conductivity-type region group is defined as a second second-conductivity-type region. The second-conductivity-type regions included in the second second-conductivity-type region group and adjacent to the first second-conductivity-type region and the second second-conductivity-type region is defined as a third second-conductivity-type region. The first electrode covers, of the first silicon carbide semiconductor layer in a region surrounded by the first second-conductivity-type region, the second second-conductivity-type region, and the third second-conductivity-type region, a position where a distance from the first second-conductivity-type region, a distance from the second second-conductivity-type region, and a distance from the third second-conductivity-type region are mutually equal. A Schottky barrier between the first electrode and the first silicon carbide semiconductor layer is larger than a Schottky barrier between the second electrode and the first silicon carbide semiconductor layer.

Of the first silicon carbide semiconductor layer in a region surrounded by the first second-conductivity-type region, second second-conductivity-type region, and third second-conductivity-type region, the position where the distance from the first second-conductivity-type region, the distance from the second second-conductivity-type region, and the distance from the third second-conductivity-type region, are mutually equal, is least readily reached by depletion layers extending from the second-conductivity-type regions. Accordingly, leak current occurs most readily at this portion when inverse bias is applied to the semiconductor device. The semiconductor device disclosed in the present specification has disposed, at the portion of the first silicon carbide semiconductor layer where leak current most readily occurs, a first electrode of which the Schottky barrier between the first electrode and the first silicon carbide semiconductor layer is larger than the Schottky barrier between the second electrode and the first silicon carbide semiconductor layer. Accordingly, inverse direction leak current can be reduced as compared to a case where the second electrode is disposed above the entirety of the first silicon carbide semiconductor layer. On the other hand, a first portion which is at least a portion of the first silicon carbide semiconductor layer between two of the second-conductivity-type regions that are adjacent and included in the first second-conductivity-type region group and the second second-conductivity-type region group, which is a portion coming into contact with each of the two adjacent second-conductivity-type regions, is a portion where depletion layers extending from the second-conductivity-type regions readily extend. The second electrode of which the Schottky barrier formed with the first silicon carbide semiconductor layer is smaller than that of the first electrode is disposed so as to cover this first portion. Accordingly, the onset voltage regarding the forward current of the diode is smaller as compared to a case where the first electrode is disposed above the entirety of the first silicon carbide semiconductor layer. Accordingly, the semiconductor device disclosed in the present specification can function as a diode having improved forward current characteristics and reduced leak current in the inverse direction.

In another aspect of the present disclosure, of the first silicon carbide semiconductor layer between the two adjacent second-conductivity-type regions included in the first second-conductivity-type region group and the second second-conductivity-type region group, an area of the first portion in contact with the second electrode may be larger than an area of a second portion which is in contact with the first electrode and is a portion of the first silicon carbide semiconductor layer between the two adjacent second-conductivity-type regions.

Thus, the forward current characteristics of the semiconductor device can be further improved.

In another aspect of the present disclosure, the first electrode may cover all of a third portion where a distance from the first second-conductivity-type region, a distance from the second second-conductivity-type region, and a distance from the third second-conductivity-type region, are each longer than half of the space S, and the third portion is a portion of the first silicon carbide semiconductor layer in a region surrounded by the first second-conductivity-type region, the second second-conductivity-type region, and the third second-conductivity-type region.

Of the first silicon carbide semiconductor layer in a region surrounded by the first second-conductivity-type region, the second second-conductivity-type region, and the third second-conductivity-type region, a portion where the distance from the first second-conductivity-type region, the distance from the second second-conductivity-type region, and the distance from the third second-conductivity-type region, are each longer than half of the space S, exhibits spreading of the depletion layers extending from the second-conductivity-type regions less readily as compared to at the first silicon carbide semiconductor layer in a region surrounded by two adjacent second-conductivity-type regions included in the first second-conductivity-type region group and the second second-conductivity-type region group. Accordingly, leak current occurs most readily at this portion when inverse bias is applied to the semiconductor device. The semiconductor device disclosed in the present specification may have disposed, at the portion of the first silicon carbide semiconductor layer where leak current readily occurs, a first electrode of which the Schottky barrier between the first electrode and the first silicon carbide semiconductor layer is larger than the Schottky barrier between the second electrode and the first silicon carbide semiconductor layer, so as to cover the entire portion. Accordingly, inverse direction leak current can be reduced as compared to a case where the second electrode is disposed above the entirety of the first silicon carbide semiconductor layer.

In another aspect of the present disclosure, the second second-conductivity-type region group may be disposed distanced from the first second-conductivity-type region group by the space S. The second electrode may further be disposed above a fourth portion where, of the first silicon carbide semiconductor layer in a region between the first second-conductivity-type region and the third second-conductivity-type region, a distance from the first second-conductivity-type region and a distance from the third second-conductivity-type region are each half as long as the space S or shorter.

Of the first silicon carbide semiconductor layer in a region between the first second-conductivity-type region and the third second-conductivity-type region, the depletion layers extending from the second-conductivity-type regions readily spread at a portion where the distance from the first second-conductivity-type region and the distance from the third second-conductivity-type region are each half as long as the space S or shorter, in the same way as in the first silicon carbide semiconductor layer between two adjacent second-conductivity-type regions included in the first second-conductivity-type region group and the second second-conductivity-type region group. Accordingly, disposing the second electrode, regarding which the Schottky barrier formed with the first silicon carbide semiconductor layer is smaller than that of the first electrode, on this portion, can further improve forward current characteristics.

In another aspect of the present disclosure, the plurality of second-conductivity-type regions included in the first second-conductivity-type region group and the second second-conductivity-type region group may be arrayed in a grid form when viewed from the direction perpendicular to the principal surface of the semiconductor substrate.

In another aspect of the present disclosure, the plurality of second-conductivity-type regions included in the first second-conductivity-type region group and the second second-conductivity-type region group may be arrayed in a staggered form when viewed from the direction perpendicular to the principal surface of the semiconductor substrate.

In another aspect of the present disclosure, if the first conductivity type is n-type, a work function of a metal included in the first electrode may be larger than a work function of a metal included in the second electrode. If the first conductivity type is p-type, a work function of a metal included in the first electrode may be smaller than a work function of a metal included in the second electrode.

This enables the Schottky barrier between the first electrode and first silicon carbide semiconductor layer to be made larger than the Schottky barrier between the second electrode and first silicon carbide semiconductor layer.

Examples of metals capable of forming a Schottky junction with silicon carbide include aluminum, titanium, molybdenum, nickel, and so forth. The work function increases in the order of aluminum, titanium, molybdenum, and nickel.

Accordingly, the combination of metals included in the first electrode and second electrode of the semiconductor device may be according to the following combinations, for example. The metal included in the first electrode may be selected from the group consisting of titanium, nickel, and molybdenum, and the metal included in the second electrode be aluminum. The metal included in the first electrode may be either of nickel and molybdenum, and the metal included in the second electrode be titanium. The metal included in the first electrode may be nickel, and the metal included in the second electrode be molybdenum.

In another aspect of the present disclosure, the first electrode and the second electrode may include a same element. Even if the first electrode and second electrode include the same type of metal, the Schottky barrier between the first electrode and first silicon carbide semiconductor layer can be made to be larger than the Schottky barrier between the second electrode and first silicon carbide semiconductor layer by performing thermal treatment only after forming the first electrode, for example.

In another aspect of the present disclosure, the semiconductor device may further include: a body region of the second conductivity type, disposed in the first silicon carbide semiconductor layer; an impurity region of the first conductivity type, disposed in the body region; a gate insulating film disposed on the body region; a gate electrode disposed on the gate insulating film; and a source electrode electrically connected to the impurity region. The second electrode and the source electrode may be electrically connected.

This arrangement enables a semiconductor device to be obtained which, in addition to the above-described portion functioning as a diode, has a portion functioning as a MISFET on the semiconductor substrate.

In another aspect of the present disclosure, the semiconductor device may further include a second silicon carbide semiconductor layer of the first conductivity type, disposed at least between the body region and the gate insulating film.

This arrangement enables a semiconductor device to be obtained which, in addition to the above-described portion functioning as a diode, has a portion functioning as an accumulation type MISFET on the semiconductor substrate.

In another aspect of the present disclosure, the semiconductor device may further include an upper electrode disposed above the source electrode, and electrically connected to the source electrode, and the upper electrode and the second electrode may be formed of the same material.

This arrangement enables the upper electrode and second electrode to be formed in the same process, so the number of processes can be reduced. Accordingly, manufacturing costs of the semiconductor device can be reduced.

In another aspect of the present disclosure, the semiconductor device may further include a barrier metal layer disposed above the source electrode, and electrically connected to the source electrode, and an upper electrode disposed above the barrier metal layer, and electrically connected to the barrier metal layer. The barrier metal layer and the first electrode may be formed of the same material.

This arrangement enables the barrier metal layer and first electrode to be formed in the same process, so the number of processes can be reduced. Accordingly, manufacturing costs of the semiconductor device can be reduced.

As described above, the upper electrode and the second electrode may be formed of the same material.

A semiconductor device manufacturing method according to an aspect of the present disclosure includes: preparing a semiconductor substrate of a first conductivity type, having a principal surface; forming a first silicon carbide semiconductor layer of the first conductivity type on the principal surface of the semiconductor substrate; forming a plurality of second-conductivity-type regions in the first silicon carbide semiconductor layer, to obtain a plurality of second-conductivity-type region groups each containing a plurality of the second-conductivity-type regions; forming a body region of the second conductivity type within the first silicon carbide semiconductor layer; forming an impurity region of a first conductivity type within the body region; forming a gate insulating film on the body region; forming a gate electrode on the gate insulating film; forming a source electrode, electrically connected to the impurity region, forming a third electrode on a rear surface of the semiconductor substrate; forming a first electrode on the first silicon carbide semiconductor layer, that forms a Schottky junction with the first silicon carbide semiconductor layer; and forming a second electrode on the first silicon carbide semiconductor layer, that forms a Schottky junction with the first silicon carbide semiconductor layer, and that is electrically connected with the first electrode and the source electrode. The plurality of second-conductivity-type region groups include a first second-conductivity-type region group containing a plurality of second-conductivity-type regions that are arrayed following one direction with a space S between each other, when viewed from a direction perpendicular to the principal surface of the semiconductor substrate, and a second second-conductivity-type region group containing a plurality of second-conductivity-type regions that are arrayed following the one direction with the space S between each other, when viewed from the direction perpendicular to the principal surface of the semiconductor substrate. The second second-conductivity-type region group is disposed in parallel with the first second-conductivity-type region group. The second electrode covers a first portion which is at least a portion of the first silicon carbide semiconductor layer between two of the second-conductivity-type regions that are adjacent and included in the first second-conductivity-type region group and the second second-conductivity-type region group, the portion being in contact with each of the two adjacent second-conductivity-type regions. One of the two adjacent second-conductivity-type regions included in the first second-conductivity-type region group is defined as a first second-conductivity-type region and the other of the two adjacent second-conductivity-type regions included in the first second-conductivity-type region group is defined as a second second-conductivity-type region. The second-conductivity-type regions included in the second second-conductivity-type region group and adjacent to the first second-conductivity-type region and the second second-conductivity-type region is defined as a third second-conductivity-type region. The first electrode covers, of the first silicon carbide semiconductor layer in a region surrounded by the first second-conductivity-type region, the second second-conductivity-type region, and the third second-conductivity-type region, a position where a distance from the first second-conductivity-type region, a distance from the second second-conductivity-type region, and a distance from the third second-conductivity-type region are mutually equal. A Schottky barrier between the first electrode and the first silicon carbide semiconductor layer is larger than a Schottky barrier between the second electrode and the first silicon carbide semiconductor layer.

This manufacturing method enables the semiconductor device disclosed in the present specification, which has a portion functioning as a diode and a portion functioning as a MISFET, to be formed on a single substrate.

In another aspect of the present disclosure, the semiconductor device manufacturing method may further include forming a second silicon carbide semiconductor layer of the first conductivity type on at least the body region, after the forming of the impurity region of a first conductivity type. The gate insulating layer may be formed on the second silicon carbide semiconductor layer, in the forming of the gate insulating film.

This manufacturing method enables the semiconductor device disclosed in the present specification, which has a portion functioning as a diode and a portion functioning as an accumulation type MISFET, to be formed on a single substrate.

In another aspect of the present disclosure, the semiconductor device manufacturing method may further include forming an upper electrode of a same material as the second electrode above the source electrode to be electrically connected to the source electrode. The forming of the second electrode and the forming of the upper electrode may be performed at the same time.

This arrangement enables the upper electrode and second electrode to be formed in the same process, so the number of processes can be reduced. Accordingly, manufacturing costs of the semiconductor device can be reduced.

In another aspect of the present disclosure, the semiconductor device manufacturing method may further include forming a barrier metal layer of a same material as the first electrode above the source electrode to be electrically connected to the source electrode; and forming an upper electrode above the barrier metal layer to be electrically connected to the barrier metal layer. The forming of the first electrode and the forming of the barrier metal layer may be performed at the same time.

This arrangement enables the barrier metal layer and first electrode to be formed in the same process, so the number of processes can be reduced. Accordingly, manufacturing costs of the semiconductor device can be reduced.

The forming of the second electrode and the forming of the upper electrode may be performed at the same time.

This arrangement enables the upper electrode and second electrode to be formed in the same process, so the number of processes can be reduced even further. Accordingly, manufacturing costs of the semiconductor device can be reduced.

Embodiments of the present disclosure will be described with reference to the drawings. Although examples will be described in the following embodiments where the first conductivity type is n-type and the second conductivity type is p-type, but this is not restrictive. The first conductivity type may be p-type and the second conductivity type may be n-type in the embodiments of the present disclosure.

First Embodiment

Structure of Semiconductor Device

Figure 2:
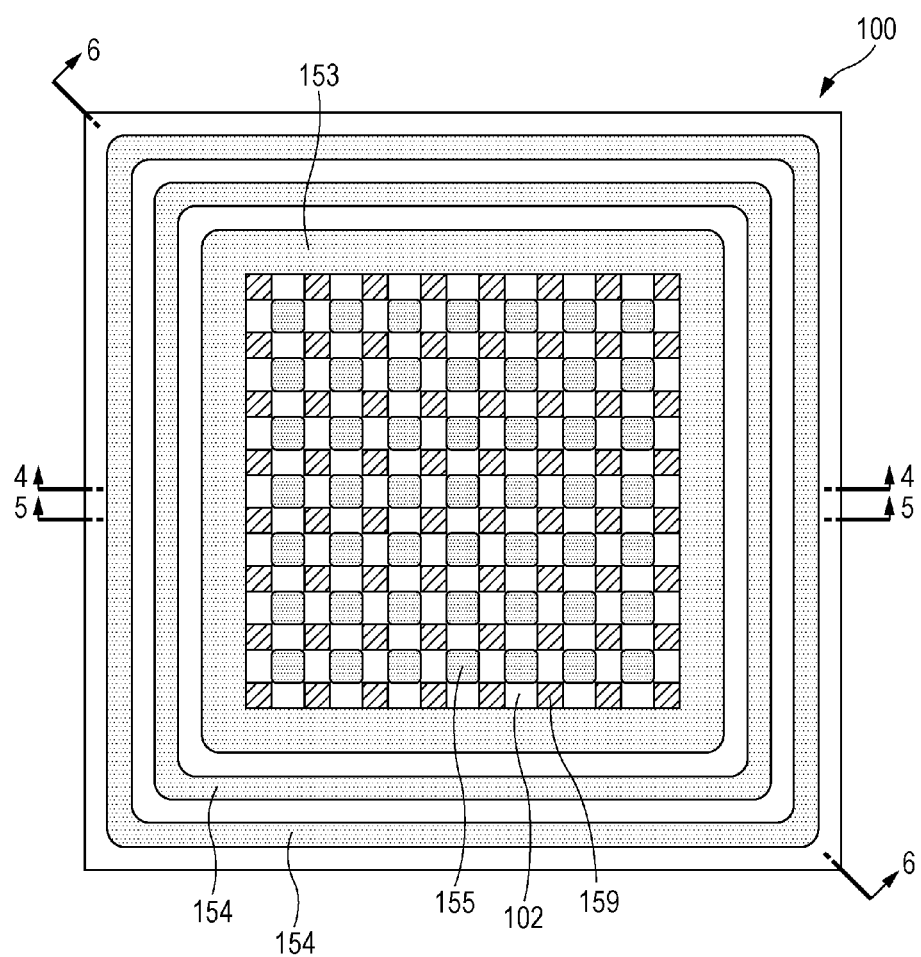
FIG. 2 is a plan view illustrating an overview of the semiconductor device according to the first embodiment of the present disclosure in a state where a second electrode has been removed.
Figure 3A:
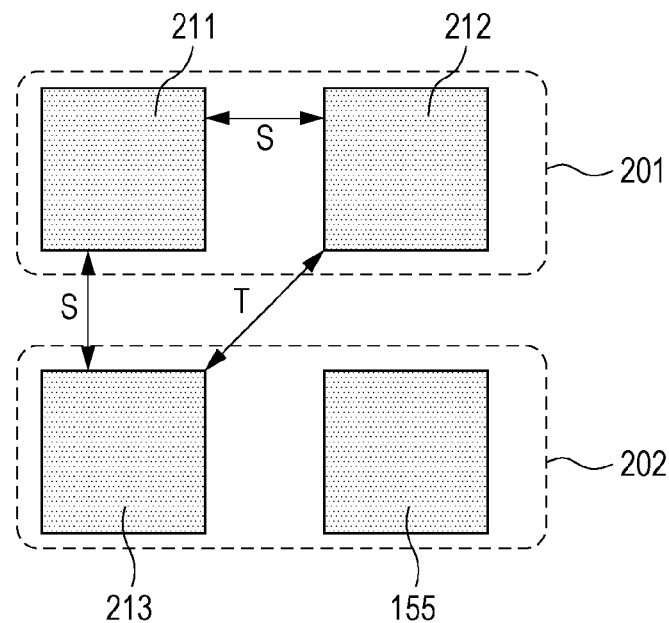
FIG. 3A is a plan view for describing a layout of second-conductivity-type regions in the semiconductor device according to the first embodiment of the present disclosure.
Figure 3B:
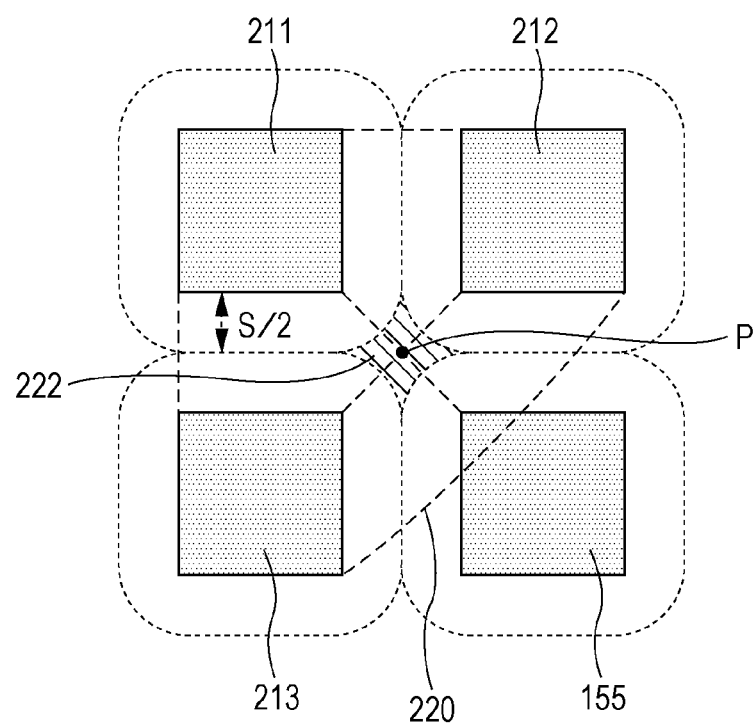
FIG. 3B is a plan view for describing a layout of first electrodes in the semiconductor device according to the first embodiment of the present disclosure.
Figure 4:
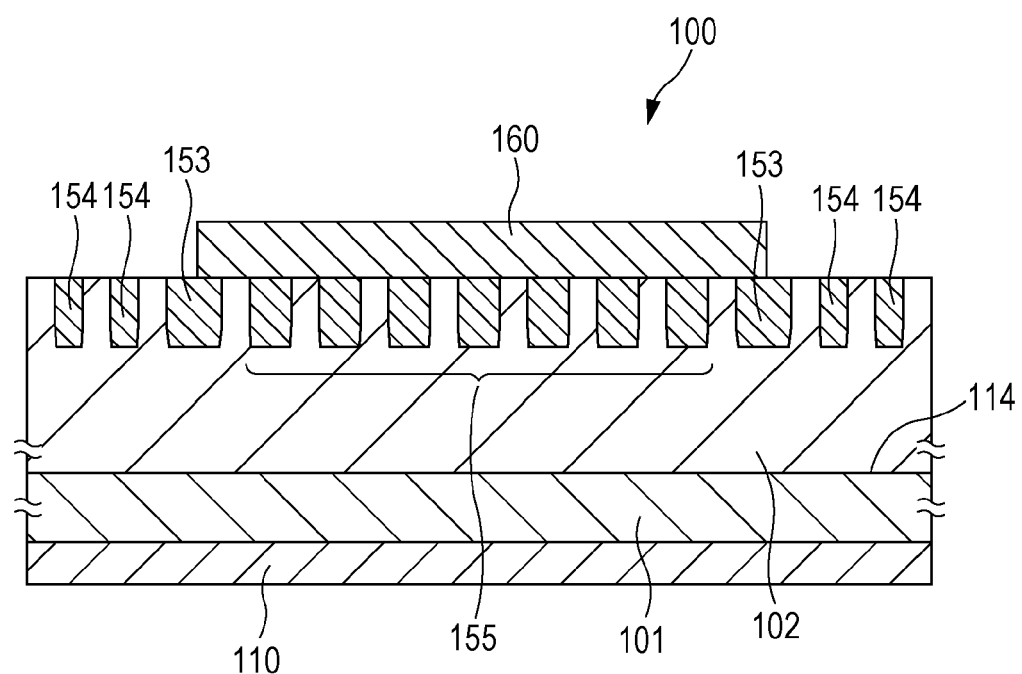
FIG. 4 is a cross-sectional view taken along line 4-4 in FIG. 2, illustrating an overview of this portion of the semiconductor device according to the first embodiment of the present disclosure.

A semiconductor device 100 according to a first embodiment of the present disclosure will be described with reference to FIGS. 1 through 6. FIG. 1 is a plan view illustrating an overview of the semiconductor device 100 according to the present embodiment. FIG. 2 is a plan view illustrating an overview of the semiconductor device 100 in a state where a second electrode 160 has been removed. FIGS. 3A and 3B are plan views for describing layouts of second-conductivity-type regions and first electrodes in the semiconductor device 100. FIG. 4 is a cross-sectional view illustrating an overview of a part along line 4-4 in FIG. 2, FIG. 5 is a cross-sectional view illustrating an overview of a part along line 5-5 in FIG. 2, and FIG. 6 is a cross-sectional view illustrating an overview of a part along line 6-6 in FIG. 2.

Figure 5:
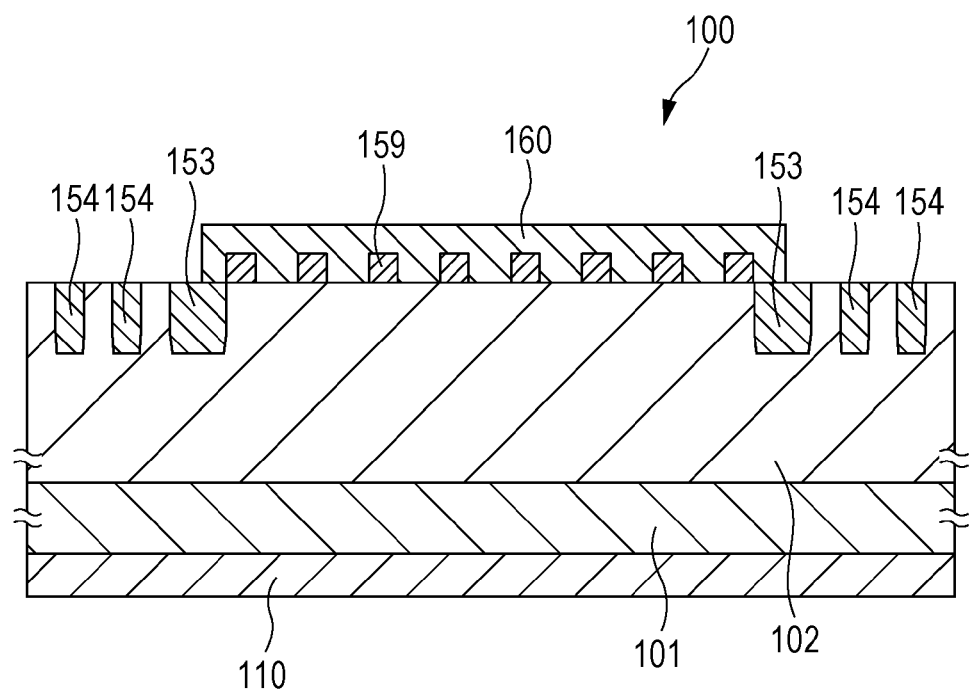
FIG. 5 is a cross-sectional view taken along line 5-5 in FIG. 2, illustrating an overview of this portion of the semiconductor device according to the first embodiment of the present disclosure.
Figure 6:
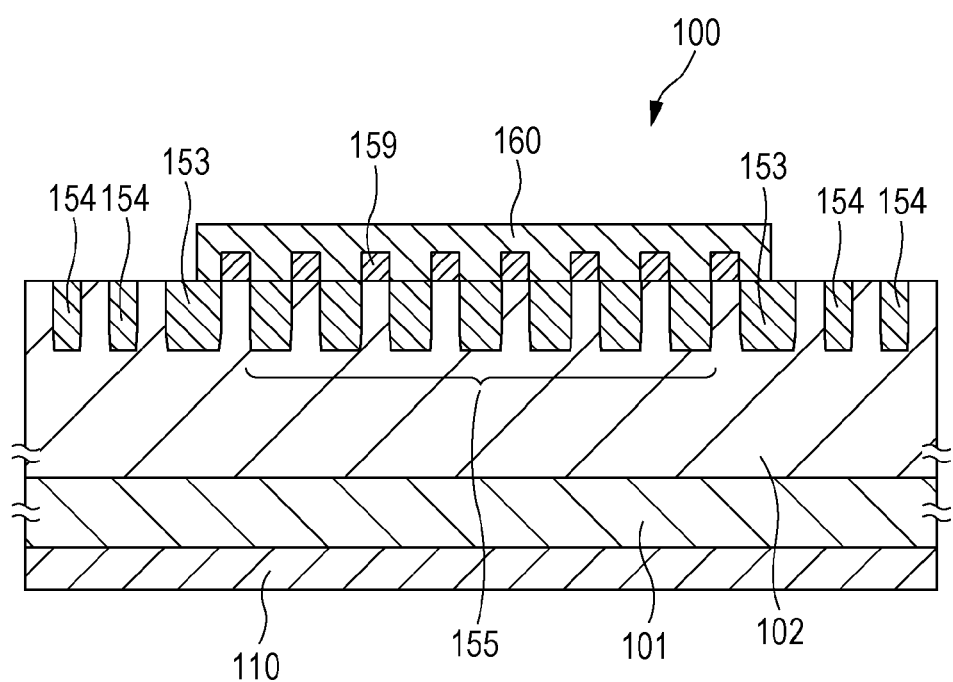
FIG. 6 is a cross-sectional view taken along line 6-6 in FIG. 2, illustrating an overview of this portion of the semiconductor device according to the first embodiment of the present disclosure.

The semiconductor device 100 includes a semiconductor substrate 101 of a first conductivity type, and a drift layer 102 which is a first silicon carbide semiconductor layer of the first conductivity type, disposed on a principal surface 114 of the semiconductor substrate 101, as illustrated in FIGS. 4 through 6. Multiple second-conductivity-type regions 155 are disposed within a part of the surface of the drift layer 102. First electrodes 159 and a second electrode 160 are disposed on the drift layer 102. The second electrode 160 is disposed above the first electrodes 159 as well, in the semiconductor device 100 according to the present embodiment. The first electrodes 159 and second electrode 160 each form Schottky junctions with the drift layer 102. The Schottky barrier between the first electrodes 159 and the drift layer 102 is greater than the Schottky barrier between the second electrode 160 and the drift layer 102. A third electrode 110 is disposed on a rear surface of the semiconductor substrate 101, which is a surface on the opposite side from the principal surface 114. The third electrode 110 forms an ohmic contact with the semiconductor substrate 101.

A guard ring region 153 of a second conductivity type is disposed within a part of the surface of the drift layer 102 so as to encompass the second-conductivity-type regions 155, as illustrated in FIGS. 1, 2, and 4. Field limiting ring (hereinafter "FLR") regions 154 of a second conductivity type are disposed within a part of the surface of the drift layer 102 so as to encompass the guard ring region 153. The second electrode 160 is disposed such that the edge of the second electrode 160 is situated above the guard ring region 153.

The multiple second-conductivity-type regions 155 of the semiconductor device 100 according to the present embodiment are disposed in a grid form when viewed from a direction perpendicular to the principal surface 114 of the semiconductor substrate 101. The second-conductivity-type regions 155 are cyclically disposed in the vertical direction and horizontal direction when viewed from the direction perpendicular to the principal surface 114 of the semiconductor substrate 101, as illustrated in FIG. 2.

FIGS. 3A and 3B are plan views for describing layouts of second-conductivity-type regions 155 and first electrodes 159 in the semiconductor device 100. FIGS. 3A and 3B illustrate, of the multiple second-conductivity-type regions 155, just four second-conductivity-type regions 155 which are adjacent with each other. The semiconductor device 100 includes a first second-conductivity-type region group 201 and a second second-conductivity-type region group 202, each containing multiple second-conductivity-type regions 155, as illustrated in FIGS. 2 and 3A. In each of the first second-conductivity-type region group 201 and second second-conductivity-type region group 202, the second-conductivity-type regions 155 are arrayed following one direction with spaces S between each, when viewed from the direction perpendicular to the principal surface 114 of the semiconductor substrate 101. The second second-conductivity-type region group 202 is disposed in parallel with the first second-conductivity-type region group 201. The second second-conductivity-type region group 202 is disposed distanced from the first second-conductivity-type region group 201 by the above space S in the semiconductor device 100 according to the present embodiment.

Now, the two adjacent second-conductivity-type regions 155 contained in the first second-conductivity-type region group 201 will be defined as a first second-conductivity-type region 211 and a second second-conductivity-type region 212, and a second-conductivity-type regions 155 included in the second second-conductivity-type region group 202 adjacent to the first second-conductivity-type region 211 and second second-conductivity-type region 212 will be defined as a third second-conductivity-type region 213, as illustrated in FIG. 3A. Note that as illustrated in FIG. 3A, the second second-conductivity-type region 212 and the third second-conductivity-type region 213 are adjacent obliquely with a spaces T therebetween. The space T is the space S multiplied by the square root of 2 in the semiconductor device 100 according to the present embodiment.

A part 222 of the drift layer 102 illustrated in FIG. 3B is a region defined by being a part of the drift layer 102 in a region 220 surrounded by the first second-conductivity-type region 211, the second second-conductivity-type region 212, and the third second-conductivity-type region 213, where the distance from the first second-conductivity-type region 211, the distance from the second second-conductivity-type region 212, and the distance from the third second-conductivity-type region 213, are all longer than half of the space S. The part 222 of the drift layer 102 is equivalent to a third portion in the present disclosure.

The first electrodes 159 are disposed on at least part of the part 222 of the drift layer 102. A point P illustrated in FIG. 3B is a position in the drift layer 102 in the region 220 where the distance from the first second-conductivity-type region 211, the distance from the second second-conductivity-type region 212, and the distance from the third second-conductivity-type region 213 are equal. The first electrodes 159 are disposed so as to cover the points P in the semiconductor device 100 according to the present embodiment, as illustrated in FIGS. 2 and 3B. Also, the first electrodes 159 are disposed so as to cover the entirety of the parts 222 of the drift layer 102 in the semiconductor device 100 according to the present embodiment, as illustrated in FIG. 2.

The second electrode 160 is electrically connected to the first electrodes 159. The second electrode 160 is disposed on the drift layer 102 between the two adjacent second-conductivity-type regions 155 included in the first second-conductivity-type region group 201 and second second-conductivity-type region group 202, as illustrated in FIGS. 2 and 4. The second electrode 160 is further disposed on a fourth portion of the drift layer 102 in a region between the first second-conductivity-type region 211 and the third second-conductivity-type region 213 in the semiconductor device 100 according to the present embodiment, where the distance from the first second-conductivity-type region 211 and the distance from the third second-conductivity-type region 213 are both half or less the above-described space S, as illustrated in FIGS. 2 and 5. Further, the second electrode 160 is also disposed on the second-conductivity-type regions 155 in the semiconductor device 100 according to the present embodiment, as illustrated in FIGS. 4 and 6.

In a case where the first conductivity type is n-type, a material having a larger work function than the material of the second electrode 160, for example, is selected for the first electrodes 159. In a case where the first conductivity type is p-type, a material having a smaller work function than the material of the second electrode 160, for example, is selected for the first electrodes 159.

Operation of the Semiconductor Device

Next, operations of the semiconductor device 100 according to the first embodiment of the present disclosure will be described with reference to FIGS. 7A through 11C. FIGS. 7A and 9A through 11C are cross-sectional views illustrating an enlarged portion of a cross-section of the semiconductor device 100 according to the present embodiment. FIGS. 7A, 7B, 7C, and 9A through 11C illustrate only a part of the drift layer 102, a part of the first electrodes 159, a part of the second electrode 160, and a part of the second-conductivity-type regions 155. FIG. 8 is a diagram schematically illustrating forward current-voltage characteristics of the semiconductor device according to the first embodiment of the present disclosure.

Figure 7A:
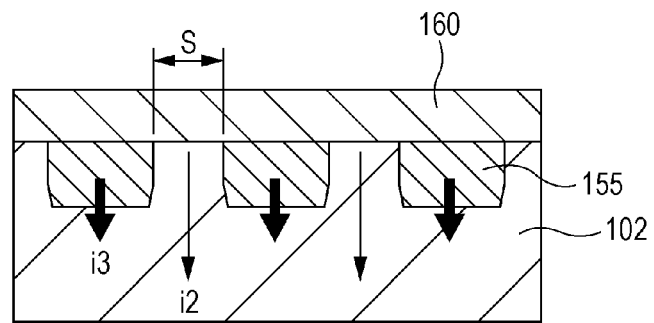
FIG. 7A is a cross-sectional view taken along line 4-4 in FIG. 2, for explaining forward current at a part of this portion of the semiconductor device according to the first embodiment of the present disclosure.
Figure 7B:
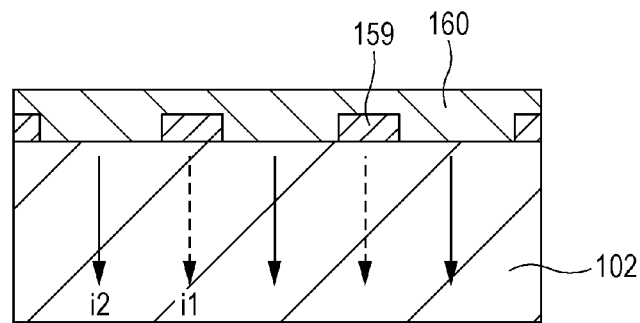
FIG. 7B is a cross-sectional view taken along line 5-5 in FIG. 2, for explaining forward current at a part of this portion of the semiconductor device according to the first embodiment of the present disclosure.
Figure 7C:
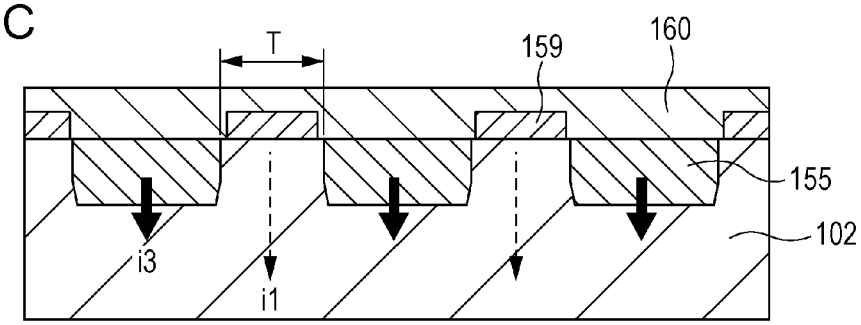
FIG. 7C is a cross-sectional view taken along line 6-6 in FIG. 2, for explaining forward current at a part of this portion of the semiconductor device according to the first embodiment of the present disclosure.
Figure 8:
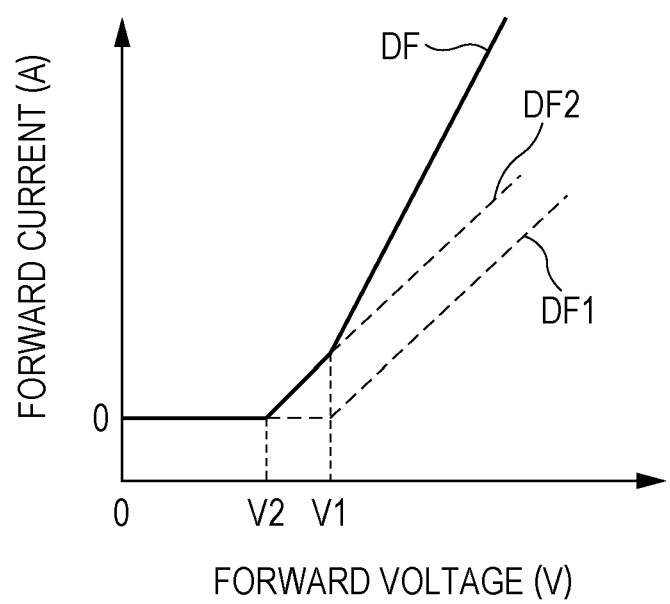
FIG. 8 is a diagram schematically illustrating forward current-voltage characteristics of the semiconductor device according to the first embodiment of the present disclosure.

FIGS. 7A, 7B, and 7C respectively illustrate cross-sections 4-4, 5-5, and 6-6 of the semiconductor device 100. Of the first electrodes 159 and the second electrode 160, the drift layer 102 is only in contact with the second electrode 160 at cross-section 4-4, as illustrated in FIG. 7A. The multiple second-conductivity-type regions 155 are cyclically disposed with the space S therebetween on the cross-section 4-4. The drift layer 102 is in contact with the first electrodes 159 and the second electrode 160 at cross-section 5-5, as illustrated in FIG. 7B. Of the first electrodes 159 and the second electrode 160, the drift layer 102 is only in contact with the first electrodes 159 at cross-section 6-6, as illustrated in FIG. 7C. The cross-section 6-6 is a cross-section including the diagonal line of the upper face of the semiconductor device 100 when viewed from the direction perpendicular to the principal surface 114 of the semiconductor substrate 101, as illustrated in FIG. 2. Accordingly, the space T between the two adjacent second-conductivity-type regions 155 at the cross-section 6-6 is larger than the space S described above. The space T is the space S multiplied by the square root of 2.

The height of the Schottky barrier between the first electrodes 159 and drift layer 102, and the height of the Schottky barrier between the second electrode 160 and the drift layer 102, are represented by φ1 and φ2, respectively. The Schottky barrier between the first electrodes 159 and the drift layer 102 is larger than the Schottky barrier between the second electrode 160 and the drift layer 102, so φ1>φ2 holds. The second-conductivity-type regions 155 and the drift layer 102 form p-n junctions, the diffusion potential thereof being written as φpn. In a case where both the second-conductivity-type regions 155 and the drift layer 102 are both formed of 4H—SiC, the φpn is around 3 V at room temperature.

The operations of the semiconductor device 100 in a case where φpn>φ1>φ2 holds will be described below. A voltage V is applied across the second electrode 160 and the third electrode 110 so that the second electrode 160 side is positive. This voltage is forward voltage, and the current at this time is forward current. The first electrodes 159 are electrically connected to the second electrode 160, and accordingly the potential of the first electrodes 159 is the same as that of the second electrode 160.

Increasing the voltage V applied across the second electrode 160 and the third electrode 110 from 0 to V>φ2 causes a current i2 to begin to flow from the portions where the second electrode 160 is in contact with the drift layer 102, as illustrated in FIGS. 7A and 7B.

Further increasing the voltage V applied across the second electrode 160 and the third electrode 110 to V>φ1 causes a current i1 to begin to flow from the portions where the first electrodes 159 are in contact with the drift layer 102, in addition to the current i2, as illustrated in FIGS. 7B and 7C.

Thus, the forward current of the semiconductor device 100 is the total current of the current i1 and the current i2. In FIG. 8, the solid line DF represents the current-voltage characteristics of the semiconductor device 100, the dashed line DF1 represents the voltage properties of the current i1, the dashed line DF2 represents the voltage properties of the current i2, and V1 and V2 represent the onset voltage of the current i1 and current i2, respectively. The onset voltage is defined as being a voltage applied to the semiconductor device when the current flowing through the semiconductor device is 1 mA, for example. Increasing the voltage V applied across the second electrode 160 and third electrode 110 from 0 first causes the current i2 to flow, so the onset voltage of the semiconductor device 100 is determined by the current i2.

The JBS described in Japanese Unexamined Patent Application Publication No. 2005-243715 only has the first electrode disposed on the drift layer, so the forward current-voltage characteristics of the JBS described therein are the characteristics indicated by the dashed line DF1. Conversely, the semiconductor device according to the present embodiment has the first electrode and second electrode disposed on the drift layer, so the forward onset voltage can be reduced as compared to the JBS described in Japanese Unexamined Patent Application Publication No. 2005-243715.

Although not illustrated in FIG. 8, further increasing the voltage V applied across the second electrode 160 and third electrode 110 causes a current i3 to start flowing as illustrated in FIGS. 7A and 7C. Current i3 is a current flowing across the p-n junction between the second-conductivity-type regions 155 and the drift layer 102. Accordingly, the current i3 begins to flow in a case where the voltage V exceeds the diffusion potential φpn of the p-n junction. The semiconductor device 100 functions as a merged p-n-junction and Schottky-barrier (MPS) diode when being used such that the current i3 flows. In a case of the semiconductor device 100 functioning as a MPS diode, the electrode in contact with the upper surface of the second-conductivity-type regions 155 preferably form ohmic contact with the second-conductivity-type regions 155.

Next, the operations of the semiconductor device 100, in a case where voltage is applied across the second electrode 160 and third electrode 110 such that the potential of the second electrode 160 on the basis of the potential of the third electrode 110 is φ2 or lower, will be described with reference to FIGS. 9A through 11C. When the potential of the second electrode 160 on the basis of the potential of the third electrode 110 is φ2 or lower, a depletion layer is formed between the first electrodes 159 and the drift layer 102, and between the second electrode 160 and the drift layer 102. If the dopant concentration at the p-type semiconductor is sufficiently high as compared to the n-type semiconductor, which together make up the p-n junction, a width w of the depletion layer extending on the n-type semiconductor side can be expressed by the Expression.

$$w = \sqrt{\frac{2 \times \varepsilon |\phi - V|}{q \times N_d}}$$

Here, where φ represents the Schottky barrier height or the diffusion potential of the p-n junction, ∈ represents the dielectric constant of the semiconductor, V represents the voltage applied to the anode electrode with the cathode electrode of the semiconductor device as a reference, q represents the elementary charge, and $N_d$ represents the dopant concentration of the n-type semiconductor. The cathode electrode corresponds to the third electrode 110, and the anode electrode corresponds to the first electrodes 159 and second electrode 160. In the semiconductor device 100, φ2<φ1<φpn holds, and accordingly a relationship of w2<w1<w3 holds where the widths of the depletion layer extending within the drift layer 102 from the second electrode 160, first electrodes 159, and second-conductivity-type regions 155, are w2, w1, and w3, respectively.

Figure 9A:
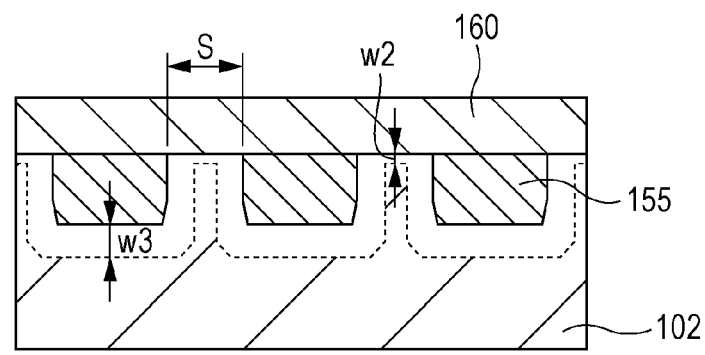
FIG. 9A is a cross-sectional view taken along line 4-4 in FIG. 2, illustrating one state of a depletion layer at a part of this portion of the semiconductor device according to the first embodiment of the present disclosure.
Figure 9B:
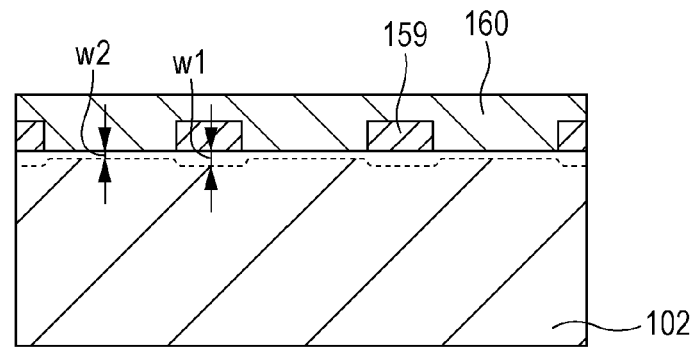
FIG. 9B is a cross-sectional view taken along line 5-5 in FIG. 2, illustrating one state of a depletion layer at a part of this portion of the semiconductor device according to the first embodiment of the present disclosure.
Figure 9C:
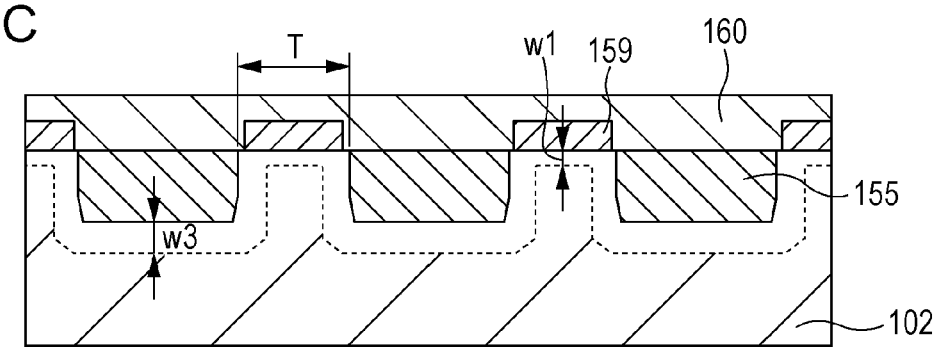
FIG. 9C is a cross-sectional view taken along line 6-6 in FIG. 2, illustrating one state of a depletion layer at a part of this portion of the semiconductor device according to the first embodiment of the present disclosure.
Figure 10A:
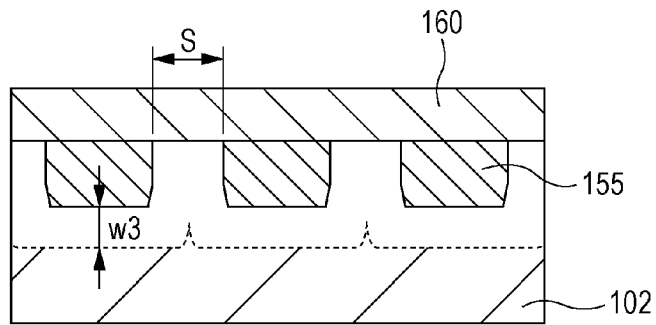
FIG. 10A is a cross-sectional view taken along line 4-4 in FIG. 2, illustrating another state of a depletion layer at a part of this portion of the semiconductor device according to the first embodiment of the present disclosure.
Figure 10B:
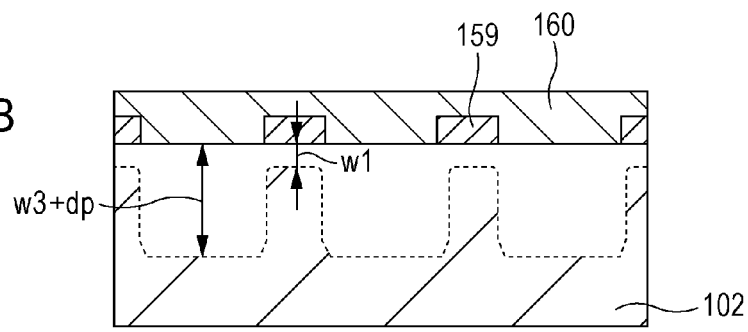
FIG. 10B is a cross-sectional view taken along line 5-5 in FIG. 2, illustrating another state of a depletion layer at a part of this portion of the semiconductor device according to the first embodiment of the present disclosure.
Figure 10C:
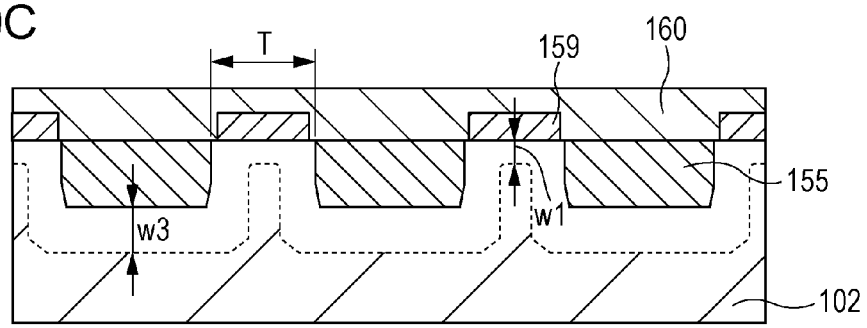
FIG. 10C is a cross-sectional view taken along line 6-6 in FIG. 2, illustrating another state of a depletion layer at a part of this portion of the semiconductor device according to the first embodiment of the present disclosure.
Figure 11A:
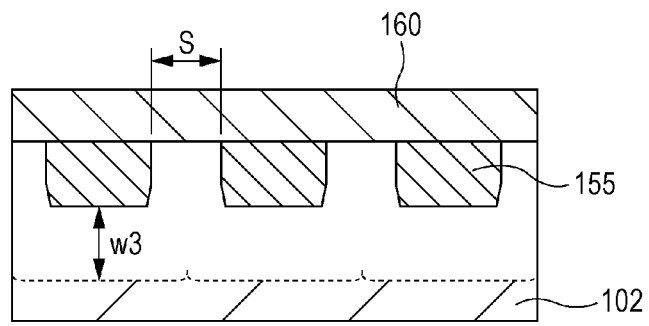
FIG. 11A is a cross-sectional view taken along line 4-4 in FIG. 2, illustrating another state of a depletion layer at a part of this portion of the semiconductor device according to the first embodiment of the present disclosure.
Figure 11B:
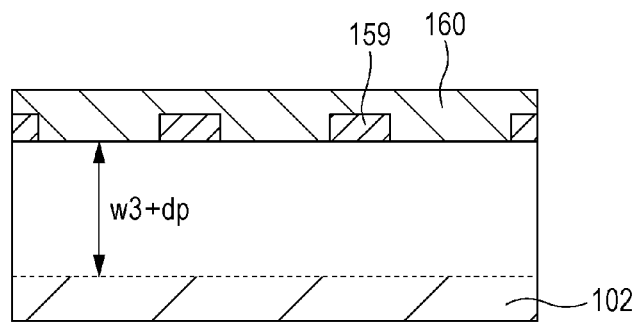
FIG. 11B is a cross-sectional view taken along line 5-5 in FIG. 2, illustrating another state of a depletion layer at a part of this portion of the semiconductor device according to the first embodiment of the present disclosure.
Figure 11C:
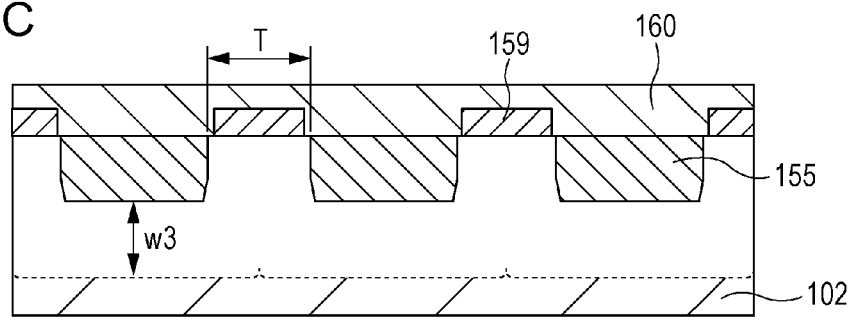
FIG. 11C is a cross-sectional view taken along line 6-6 in FIG. 2, illustrating another state of a depletion layer at a part of this portion of the semiconductor device according to the first embodiment of the present disclosure.

FIGS. 9A through 11C are diagrams illustrating the state of the depletion layer extending within the drift layer 102 from the second electrode 160, first electrodes 159, and second-conductivity-type regions 155, in the semiconductor device 100 according to the present embodiment. FIGS. 9A, 10A, and 11A illustrate a part of the 4-4 cross-section of the semiconductor device 100, FIGS. 9B, 10B, and 11B illustrate a part of the 5-5 cross-section of the semiconductor device 100, and FIGS. 9C, 10C, and 11C illustrate a part of the 6-6 cross-section of the semiconductor device 100. The edge of the depletion layer extending within the drift layer 102 is indicated by a dotted line in FIGS. 9A through 11C.

FIGS. 9A through 9C are diagrams illustrating a state of the depletion layer, where a depletion layer extending from a second-conductivity-type region 155 is not connected to a depletion layer extending from an adjacent second-conductivity-type region 155. A depletion layer having the width w3, due to the p-n junction, extends from the interface of the second-conductivity-type regions 155 and the drift layer 102, as illustrated in FIGS. 9A and 9C. A depletion layer having the width w2, due to the Schottky barrier, extends from the interface of the second electrode 160 and the drift layer 102, as illustrated in FIGS. 9A and 9B. A depletion layer having the width w1, due to the Schottky barrier, extends from the interface of the first electrodes 159 and the drift layer 102, as illustrated in FIGS. 9B and 9C. As described above, the depletion layer widths w1, w2, and w3, satisfy the relationship of w2<w1<w3.

Next, FIGS. 10A through 10C illustrate a state in which the voltage applied across the second electrode 160 and third electrode 110 is increased to where a depletion layer extending from a second-conductivity-type region 155 is connected to a depletion layer extending from an adjacent second-conductivity-type region 155. The depletion layer is connected among adjacent second-conductivity-type regions 155 in FIG. 10A, so the drift layer 102 below the interface of the second electrode 160 and the drift layer 102 is protected by the depletion layer extending from the second-conductivity-type regions 155. This depletion layer cuts off leak current of the semiconductor device 100 at the drift layer 102 below the interface of the second electrode 160 and the drift layer 102. The drift layer 102 below the interface of the second electrode 160 and the drift layer 102 is sandwiched between second-conductivity-type regions 155 in the near-far side of the drawing in the cross-section 5-5 illustrated in FIG. 10B, which can be understood from FIG. 2. The depletion layer extending from one second-conductivity-type region 155 is connected with depletion layers extending from adjacent second-conductivity-type regions 155, so a thick depletion layer is observed within the drift layer 102 in contact with the second electrode 160. Accordingly, the drift layer 102 below the interface of the second electrode 160 and the drift layer 102 is protected by the depletion layer extending from the second-conductivity-type regions 155 in FIG. 10B as well. This depletion layer cuts off leak current of the semiconductor device 100 at the drift layer 102 below the interface of the second electrode 160 and the drift layer 102. The width of this depletion layer can be generally expressed as w3+dp, where dp is the depth of the second-conductivity-type regions 155 from the surface of the drift layer 102. A depletion layer of the width w1, due to the Schottky barrier, extends from the interface of the first electrodes 159 and the drift layer 102, as illustrated in FIGS. 10B and 10C.

In a conventional JBS where the only electrode disposed above the drift layer is the second electrode, the width of the depletion layer, due to the Schottky barrier existing between depletion layers from adjacent p-n junctions, at the 5-5 cross-section and the 6-6 cross-section, is w2. Conversely, in the semiconductor device according to the present embodiment, the first electrodes are disposed on the drift layer at the 5-5 cross-section and the 6-6 cross-section. Accordingly, the depletion layer due to the Schottky barrier existing between depletion layers from adjacent p-n junctions at the 5-5 cross-section and the 6-6 cross-section is thicker as compared to conventional JBSs. Thus, inverse-direction leak current can be reduced in the semiconductor device according to the present embodiment.

Next, FIGS. 11A through 11C illustrate a state in which depletion layers extending from the second-conductivity-type regions 155 are connected beneath the first electrodes 159, by voltage being applied across the second electrode 160 and third electrode 110 such that the potential of the second electrode 160 as to the third electrode 110 is sufficiently negative. In this case, a depletion layer due to the p-n junction extends through all of the cross-sections illustrated in FIGS. 11A through 11C. This depletion layer cuts off leak current at all cross-sections illustrated in FIGS. 11A through 11C.

Manufacturing Method of Semiconductor Device

Next, a method of manufacturing the semiconductor device 100 according to the present embodiment will be described with reference to FIGS. 12A through 17B. FIGS. 12A through 17B are cross-sectional views illustrating a part of the manufacturing method of the semiconductor device 100 according to the present embodiment. FIGS. 12A, 13A, 14A, 15A, 16A, and 17A illustrate a part of cross-section 4-4 illustrated in FIG. 2, and FIGS. 12B, 13B, 14B, 15B, 16B, and 17B illustrate a part of cross-section 5-5 illustrated in FIG. 2.

First, a semiconductor substrate 101 is prepared. The semiconductor substrate 101 is a low-resistive n-type 4H—SiC off-cut substrate, having resistivity of, for example, around 0.02 Ω·cm.

Figure 12A:
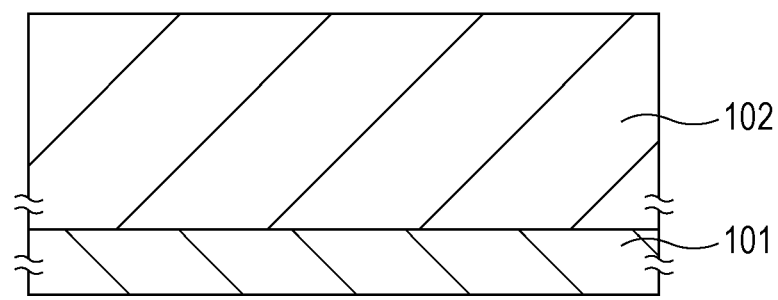
FIG. 12A is a partial cross-sectional view along line 4-4 in FIG. 2, illustrating a part of a manufacturing method of the semiconductor device according to the first embodiment of the present disclosure.
Figure 12B:
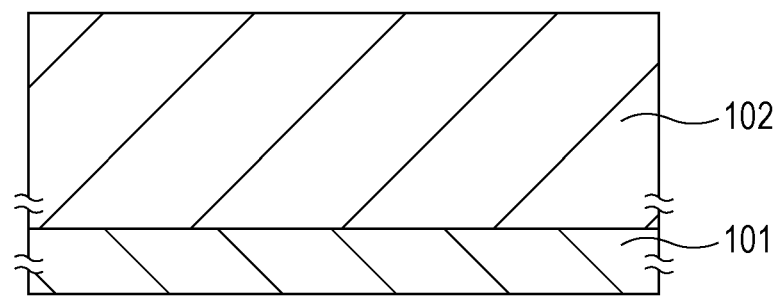
FIG. 12B is a partial cross-sectional view along line 5-5 in FIG. 2, illustrating a part of a manufacturing method of the semiconductor device according to the first embodiment of the present disclosure.

A highly resistive n-type drift layer 102 is epitaxially grown on the semiconductor substrate 101, as illustrated in FIGS. 12A and 12B. Before the forming of the drift layer 102, a buffer layer may be deposited on the semiconductor substrate 101 using n-type high-impurity-concentration SiC. The impurity concentration of the buffer layer is, for example, $1\times10^{18}$ cm$^{-3}$, and the thickness of the buffer layer is, for example, 1 μm. The drift layer 102 is configured using, for example, n-type 4H—SiC, and the impurity concentration and thickness thereof are, for example, $1\times10^{16}$ cm$^{-3}$ and 10 μm, respectively.

Figure 13A:
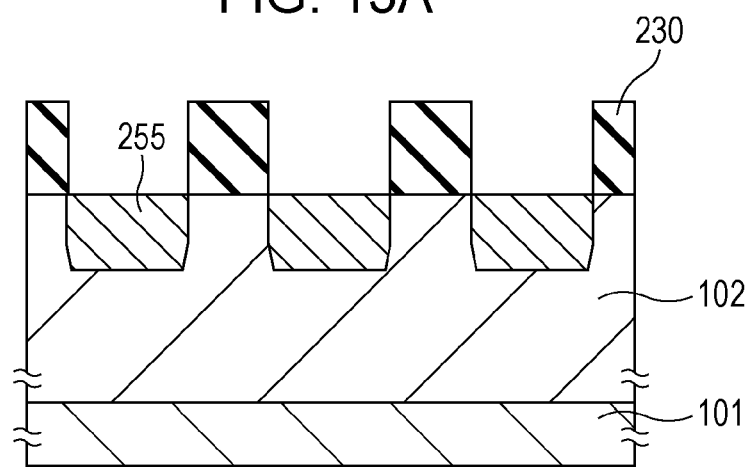
FIG. 13A is a partial cross-sectional view along line 4-4 in FIG. 2, illustrating a part of a manufacturing method of the semiconductor device according to the first embodiment of the present disclosure.
Figure 13B:
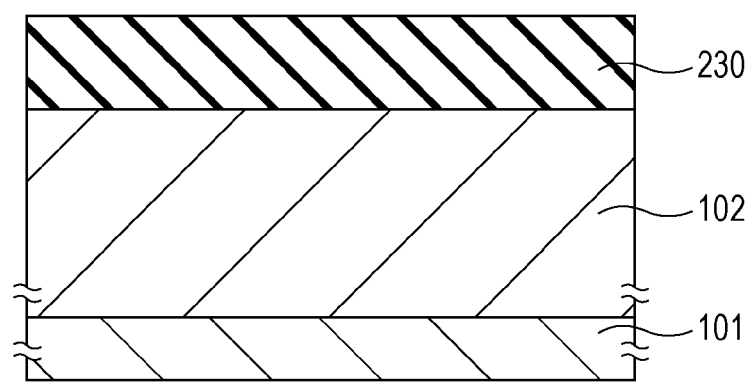
FIG. 13B is a partial cross-sectional view along line 5-5 in FIG. 2, illustrating a part of a manufacturing method of the semiconductor device according to the first embodiment of the present disclosure.

Next, with reference to FIGS. 13A and 13B, a mask 230 formed of SiO$_2$, for example, is formed on the drift layer 102, and thereafter, aluminum (Al) ions, for example, are implanted into the drift layer 102. The ion implantation energy and dose is adjusted such that the concentration of implanted Al ions is around $2\times10^{18}$ cm$^{-3}$, and the depth of implanted Al ions is around 0.5 to 1.0 μm. The term "depth" as used here means the distance from the surface of the drift layer to a position in the drift layer where the concentration of implanted Al ions and the concentration of n-type impurities is equal. Ion implantation regions 255 formed in the process later become the p-type second-conductivity-type regions 155. Although omitted from illustration, ion implantation to form guard ring regions 153 and FLR regions 154 is performed at the same time as forming the ion implantation regions 255. By performing these implantations at the same time, the impurity concentration depth profiles of the guard ring regions 153, FLR regions 154, and second-conductivity-type regions 155 in the direction perpendicular to the principal surface of the semiconductor substrate 101 become the same.

Figure 14A:
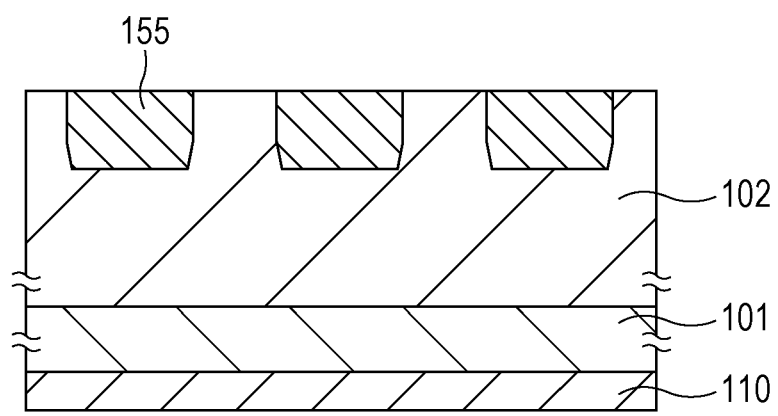
FIG. 14A is a partial cross-sectional view along line 4-4 in FIG. 2, illustrating a part of a manufacturing method of the semiconductor device according to the first embodiment of the present disclosure.
Figure 14B:
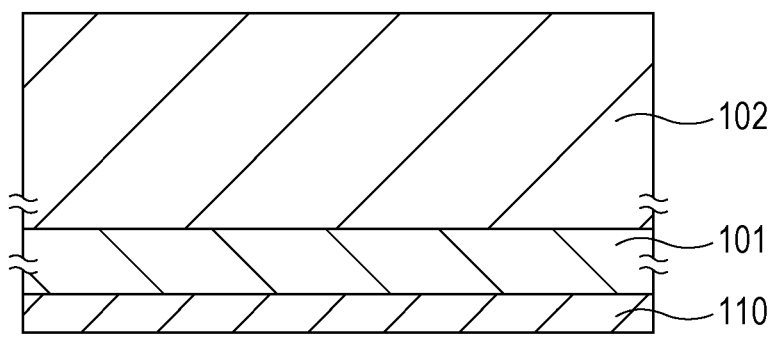
FIG. 14B is a partial cross-sectional view along line 5-5 in FIG. 2, illustrating a part of a manufacturing method of the semiconductor device according to the first embodiment of the present disclosure.

Next, with reference to FIGS. 14A and 14B, after removal of the mask 230, the article is treated by heat at a temperature of around 1500 to 1900° C., thereby forming the second-conductivity-type regions 155. Note that a carbon layer may be deposited on the surface of the drift layer 102 before treating with heat, and the carbon layer is removed thereafter. Also, the surface of the drift layer 102 may be cleansed by forming a thermally oxidized film formed on the drift layer 102 and thereafter removing the thermally oxidized film by etching. The space S between adjacent second-conductivity-type regions 155 illustrated in FIG. 7A is 2 μm, for example. The space S is set in accordance with the work function of the second electrode 160, and may be around 0.5 to 10 μm. The width of the second-conductivity-type regions 155 may be around 0.5 to 5 μm.

Next, nickel (Ni) for example is deposited to a thickness of around 200 nm on the rear surface side of the semiconductor substrate 101, then thermally treated at approximately 1000° C., thereby forming the third electrode 110. The third electrode 110 forms an ohmic contact with the semiconductor substrate 101.

Figure 15A:
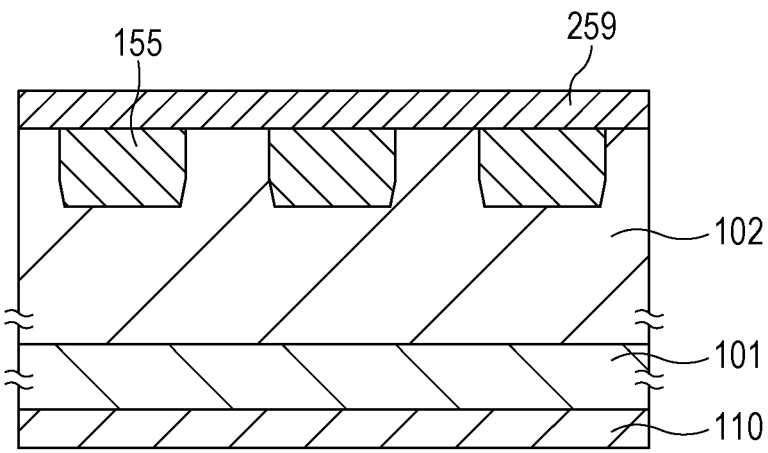
FIG. 15A is a partial cross-sectional view along line 4-4 in FIG. 2, illustrating a part of a manufacturing method of the semiconductor device according to the first embodiment of the present disclosure.
Figure 15B:
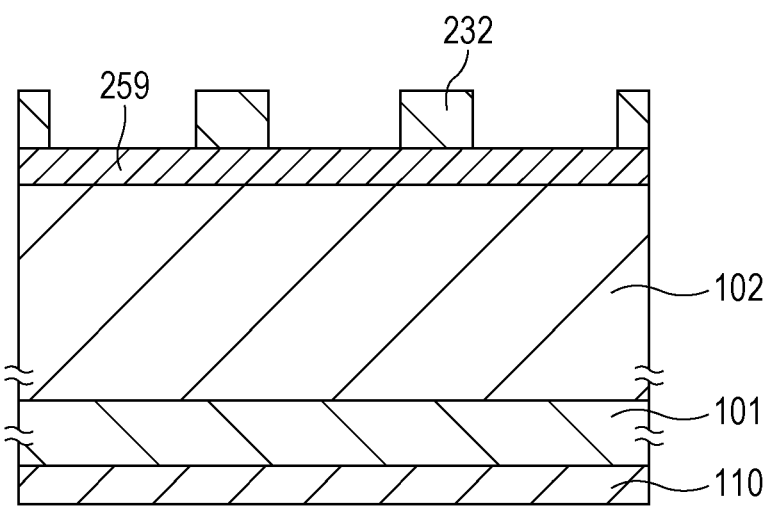
FIG. 15B is a partial cross-sectional view along line 5-5 in FIG. 2, illustrating a part of a manufacturing method of the semiconductor device according to the first embodiment of the present disclosure.

Next, a first metal layer 259, which will later serve as the first electrodes 159, is deposited on the drift layer 102 as illustrated in FIGS. 15A and 15B. A titanium (Ti) layer may be formed to a thickness of around 100 nm, for example, as the first metal layer 259. Next, a mask 232 is formed using photoresist, following which portions of the first metal layer 259 not covered by the mask 232 are removed by wet etching. This patterns the first metal layer 259.

Figure 16A:
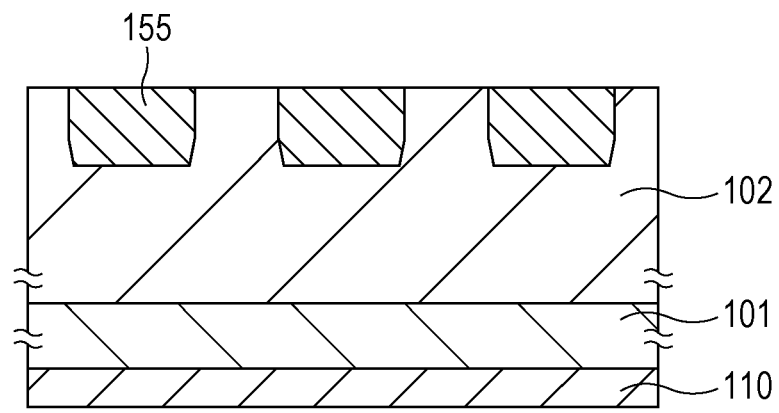
FIG. 16A is a partial cross-sectional view along line 4-4 in FIG. 2, illustrating a part of a manufacturing method of the semiconductor device according to the first embodiment of the present disclosure.
Figure 16B:
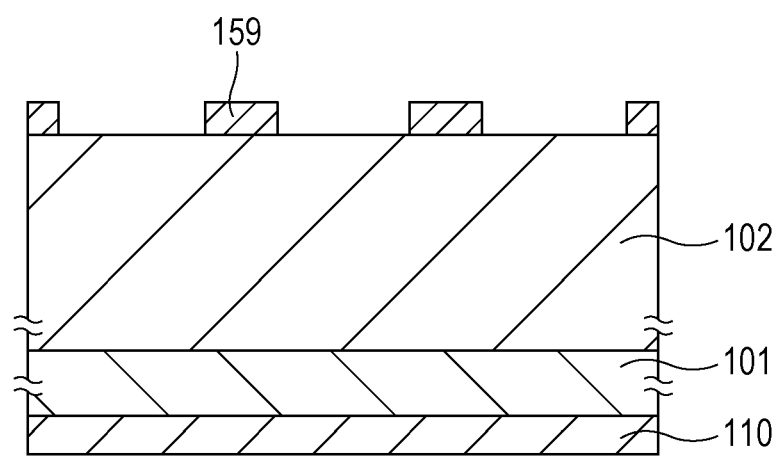
FIG. 16B is a partial cross-sectional view along line 5-5 in FIG. 2, illustrating a part of a manufacturing method of the semiconductor device according to the first embodiment of the present disclosure.

Next, with reference to FIGS. 16A and 16B, the semiconductor substrate 101 upon which the first metal layer 259 has been patterned is thermally treated at a temperature no lower than 100° C. but no higher than 700° C., thereby forming the first electrodes 159. The first electrodes 159 form Schottky junctions with the drift layer 102. In a case where the first metal layer 259 is a Ti layer for example, the height $\phi 1$ of the Schottky barrier formed between the first electrodes 159 and the drift layer 102 can be changed by this thermal treatment. For example, thermally treating at around 400° C., for example, can increase the height $\phi 1$ of the Schottky barrier as compared to a case where no thermal treatment is performed.

Figure 17A:
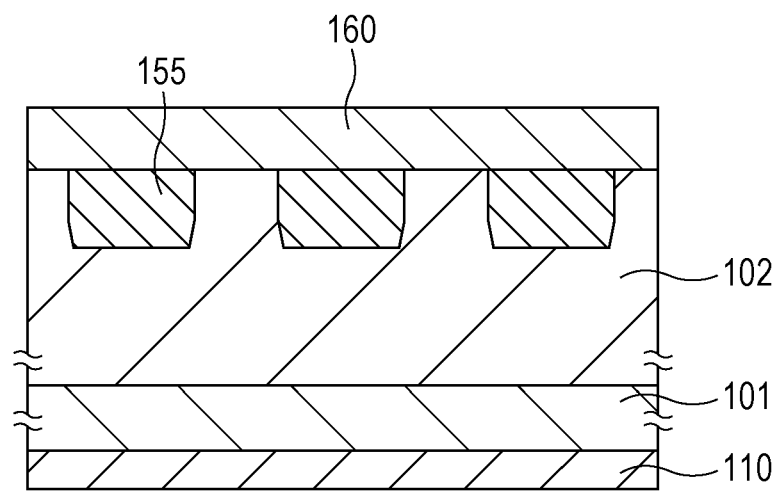
FIG. 17A is a partial cross-sectional view along line 4-4 in FIG. 2, illustrating a part of a manufacturing method of the semiconductor device according to the first embodiment of the present disclosure.
Figure 17B:
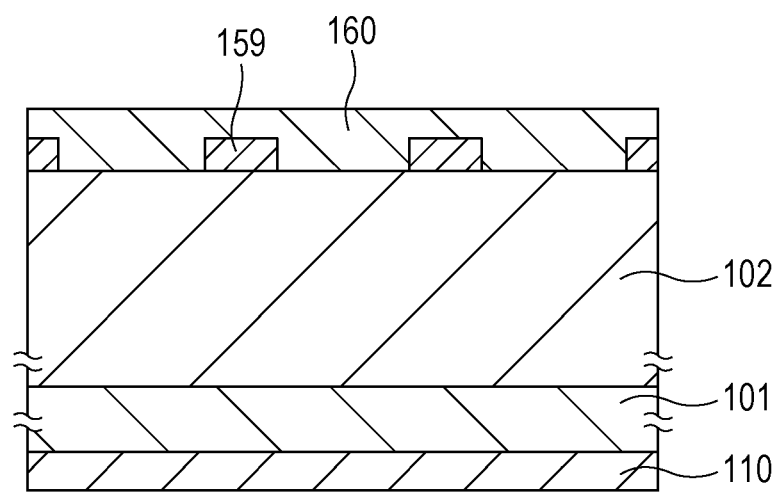
FIG. 17B is a partial cross-sectional view along line 5-5 in FIG. 2, illustrating a part of a manufacturing method of the semiconductor device according to the first embodiment of the present disclosure.

Next, with reference to FIGS. 17A and 17B, an Al layer, for example, is deposited as the second electrode 160 on the drift layer 102 having the first electrodes 159, as illustrated in FIGS. 17A and 17B. The material for the second electrode 160 is selected from metals having a smaller work function as compared to the metal included in the first electrodes 159 after thermal treatment, for example. The second electrode 160 is etched to a desired shape, as illustrated in FIG. 1 for example.

Thereafter, a passivation film covering the FLR regions 154 is formed as necessary, following which a metal electrode is formed on the third electrode 110, thereby yielding the semiconductor device 100. Examples of the passivation film include a $SiO_2$ film, a SiN film, a polyimide film, and so forth. The metal electrode may be formed by layering Ti, Ni, and silver (Ag), in that order from the side in contact with the third electrode 110, for example.

Modification 1

Figure 18A:
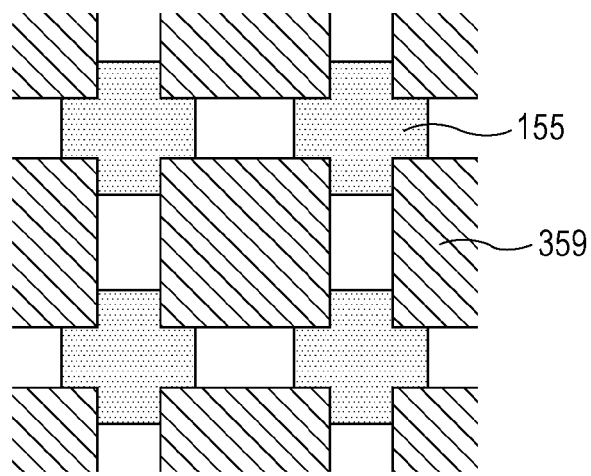
FIG. 18A is a plan view illustrating a modification of a layout of first electrodes in the semiconductor device according to the first embodiment of the present disclosure.
Figure 18B:
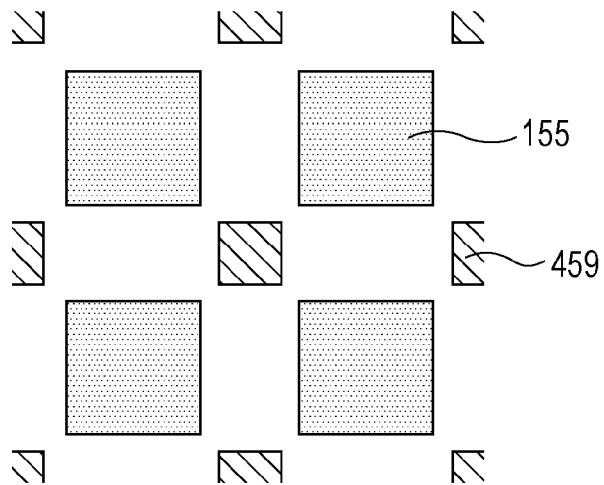
FIG. 18B is a plan view illustrating a modification of a layout of first electrodes in the semiconductor device according to the first embodiment of the present disclosure.
Figure 18C:
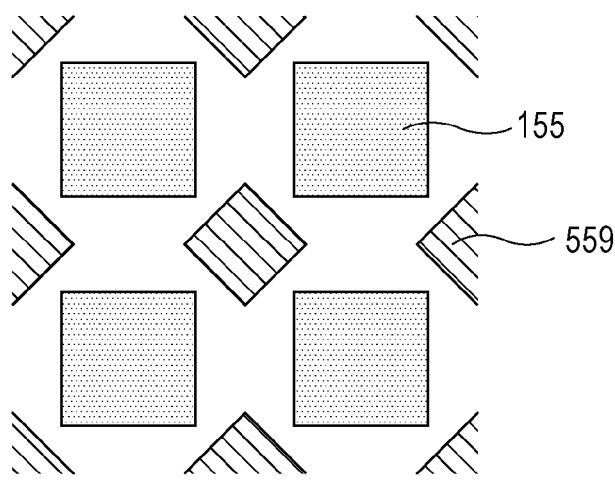
FIG. 18C is a plan view illustrating a modification of a layout of first electrodes in the semiconductor device according to the first embodiment of the present disclosure.

Next, modifications of the semiconductor device according to the present embodiment will be described with reference to FIGS. 18A through 18C. FIGS. 18A through 18C are plan views illustrating modifications of the layout of the first electrodes in the semiconductor device according to the present embodiment.

In a modification illustrated in FIG. 18A, first electrodes 359 are arranged so as to overlap a part of the second-conductivity-type regions 155. In a modification illustrated in FIG. 18B, first electrodes 459 are arranged so as to not come into contact with the second-conductivity-type regions 155. Although an example has been described regarding the semiconductor device 100 according to the present embodiment where the planar shape of the first electrodes 159 is a square shape, but the planar shape of the first electrodes is not restricted to this. In a modification illustrated in FIG. 18C, the planar shape of first electrodes 559 is a diamond shape. The planar shape of the first electrodes may be other polygons or may be circular, for example.

In each of the modifications illustrated in FIGS. 18A through 18C, the first electrodes are laid out so as to at least cover the center of the region between two second-conductivity-type regions 155 adjacent to each other obliquely, when viewed from the direction perpendicular to the principal surface 114 of the semiconductor substrate 101. The center of the region between the two second-conductivity-type regions 155 corresponds to the point P which is a position in the drift layer 102 where, in the region 220 surrounded by the first second-conductivity-type region 211, the second second-conductivity-type region 212, and the third second-conductivity-type region 213, the distance from the first second-conductivity-type region 211, the distance from the second second-conductivity-type region 212, and the distance from the third second-conductivity-type region 213 are equal. The point P is a point where the depletion layers extending from the corners of the adjacent second-conductivity-type regions 155 on the surface of the drift layer 102 least readily connect. Accordingly, in each of the modifications illustrated in FIGS. 18A through 18C, the first electrodes are laid out so as to cover the points P, so inverse direction leak current can be effectively reduced in the same way as with the semiconductor device 100 according to the first embodiment. Additionally, the first electrodes 359 in the modification illustrated in FIG. 18A are laid out so as to overlap a part of the second-conductivity-type regions 155, so inverse direction leak current can be reduced in a sure manner even if there is variance in positioning when forming the first electrodes 359. Also, the first electrodes 459 in the modification illustrated in FIG. 18B are laid out so as not to come into contact with the second-conductivity-type regions 155. Thus, the contact area of the second electrode and the drift layer 102 increases, so the forward current characteristics can be further improved as compared with the semiconductor device 100.

Second Embodiment

Figure 19A:
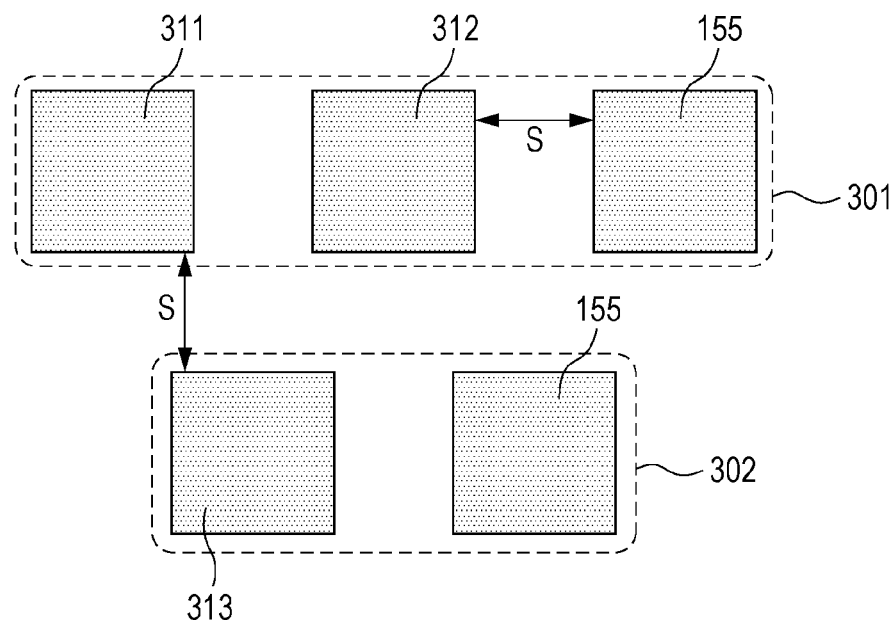
FIG. 19A is a plan view illustrating a partial layout of second conductive type regions in a semiconductor device according to a second embodiment of the present disclosure.
Figure 19B:
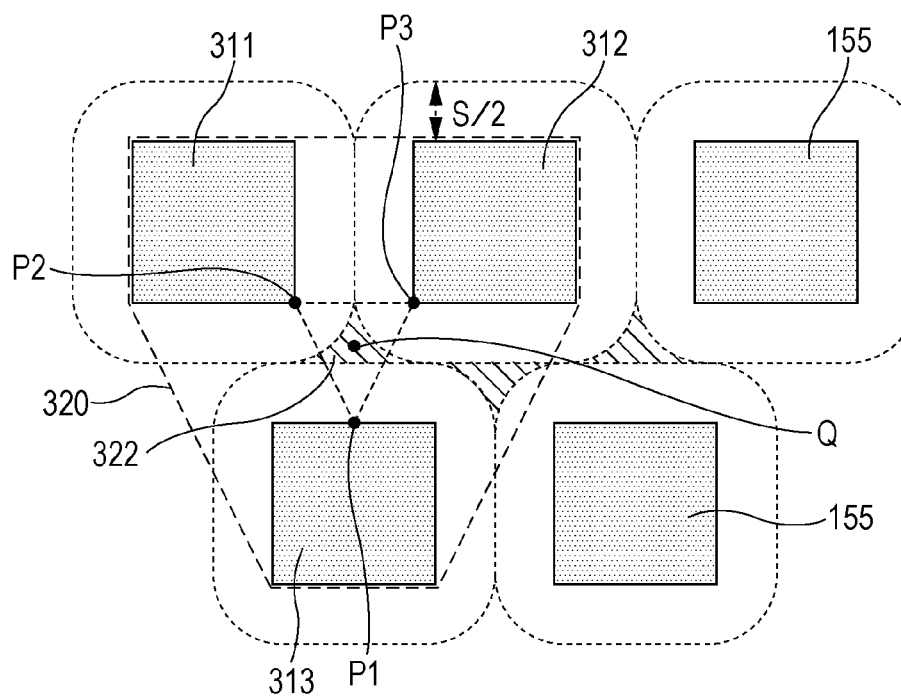
FIG. 19B is a plan view illustrating a partial layout of second conductive type regions in the semiconductor device according to the second embodiment of the present disclosure.
Figure 20:
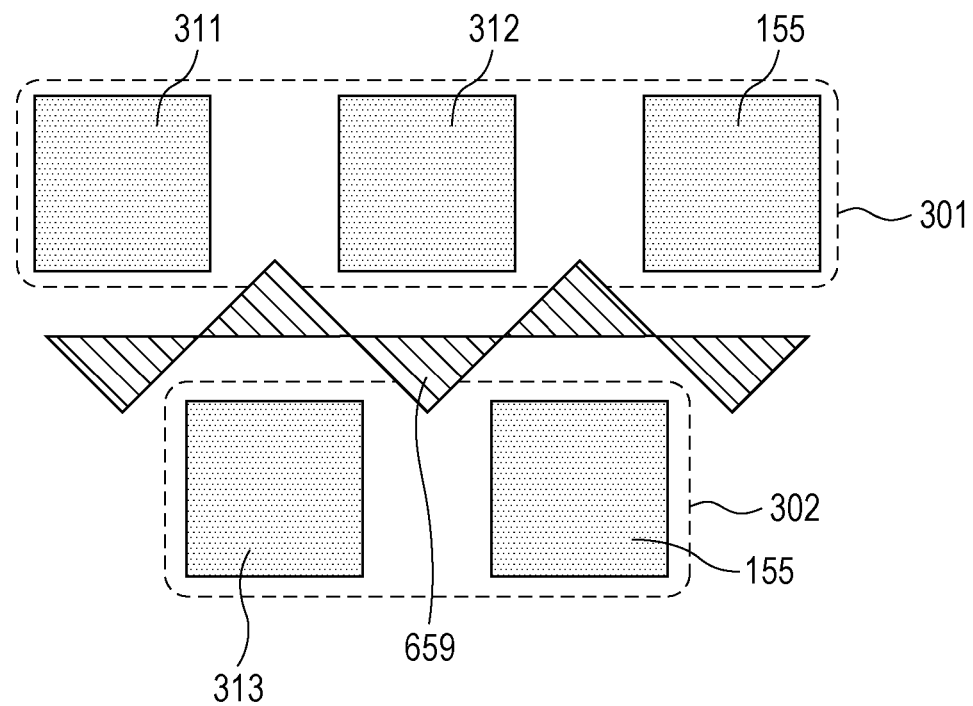
FIG. 20 is a plan view illustrating a partial layout of first electrodes in the semiconductor device according to the second embodiment of the present disclosure.

Next, a semiconductor device according to a second embodiment of the present disclosure will be described with reference to FIGS. 19A through 20. FIGS. 19A and 19B are plan views illustrating a partial layout of the second-conductivity-type regions 155 in a semiconductor device according to the present embodiment. Out of the multiple second-conductivity-type regions 155, only five adjacent second-conductivity-type regions 155 are illustrated in FIGS. 19A and 19B. FIG. 20 is a plan view illustrating a partial layout of second-conductivity-type regions and first electrodes in the semiconductor device according to the present embodiment.

The semiconductor device according to the present embodiment differs from the semiconductor device 100 according to the first embodiment with regard to the layout of the second-conductivity-type regions. Other structures, operations, and manufacturing methods are the same as those of the semiconductor device 100 according to the first embodiment, so description thereof will be omitted.

The multiple second-conductivity-type regions 155 in the semiconductor device according to the present embodiment are arrayed in a staggered alignment when viewed from the direction perpendicular to the principal surface 114 of the semiconductor substrate 101. The semiconductor device has a first second-conductivity-type region group 301 and a second second-conductivity-type region group 302, each containing multiple second-conductivity-type regions 155, as illustrated in FIG. 19A. In each of the first second-conductivity-type region group 301 and second second-conductivity-type region group 302, the multiple second-conductivity-type regions 155 are arrayed following one direction with spaces S between each other, when viewed from the direction perpendicular to the principal surface 114 of the semiconductor substrate 101. The second second-conductivity-type region group 302 is disposed in parallel with the first second-conductivity-type region group 301. The second second-conductivity-type region group 302 is disposed distanced from the first second-conductivity-type region group 301 by the above space S in the semiconductor device according to the present embodiment. The multiple second-conductivity-type regions 155 contained in the second second-conductivity-type region group 302 are situated at positions shifted half-cycle sideways from the multiple second-conductivity-type regions 155 contained in the first second-conductivity-type region group 301.

Now, as illustrated in FIG. 19A, the two adjacent second-conductivity-type regions 155 contained in the first second-conductivity-type region group 301 will be defined as a first second-conductivity-type region 311 and a second second-conductivity-type region 312, and a second-conductivity-type regions 155 included in the second second-conductivity-type region group 302 adjacent to the first second-conductivity-type region 311 and second second-conductivity-type region 312 will be defined as a third second-conductivity-type region 313.

A part 322 of the drift layer 102 illustrated in FIG. 19B is a region defined by being a part of the drift layer 102 in a region 320 surrounded by the first second-conductivity-type region 311, the second second-conductivity-type region 312, and the third second-conductivity-type region 313, where the distance from the first second-conductivity-type region 311, the distance from the second second-conductivity-type region 312, and the distance from the third second-conductivity-type region 313, are all longer than half of the space S. The part 322 of the drift layer 102 is equivalent to a third portion in the present disclosure.

First electrodes 659 are disposed on at least part of the part 322 of the drift layer 102. A point Q illustrated in FIG. 19B is a position in the drift layer 102 in the region 320 where the distance from the first second-conductivity-type region 311, the distance from the second second-conductivity-type region 312, and the distance from the third second-conductivity-type region 313 are equal. The first electrodes 659 are disposed so as to cover the points Q in the semiconductor device according to the present embodiment, as illustrated in FIGS. 19B and 20.

Referring to the midpoint of a side close to the first second-conductivity-type region group 301 out of the sides defining the third second-conductivity-type region 313 as P1, a corner of the first second-conductivity-type region 311 close to the third second-conductivity-type region 313 as P2, and a corner of the second second-conductivity-type region 312 close to the third second-conductivity-type region 313 as P3, the circumcenter of an isosceles triangle defined by the points P1, P2, and P3 is the point Q in the semiconductor device according to the present embodiment, as illustrated in FIG. 19B. The point Q is a position in the region 320 in the drift layer 102 where the distance from the first second-conductivity-type region 311, the distance from the second second-conductivity-type region 312, and the distance from the third second-conductivity-type region 313 are equal, and accordingly is a position where the depletion layers extending from the first second-conductivity-type region 311, the second second-conductivity-type region 312, and the third second-conductivity-type region 313 least readily connect.

The first electrodes 659 in the semiconductor device according to the present embodiment are laid out so as to cover the entirety of the portion 322 of the drift layer 102 including the point Q as illustrated in FIG. 20, so inverse direction leak current can be reduced in the semiconductor device according to the present embodiment, in the same way as with the semiconductor device 100 according to the first embodiment.

Modification 2

Next, modifications of the semiconductor device according to the second embodiment will be described with reference to FIGS. 21A through 22B. FIGS. 21A through 22B are plan views illustrating modifications of the layout of the first electrodes in the semiconductor device according to the second embodiment.

Figure 21A:
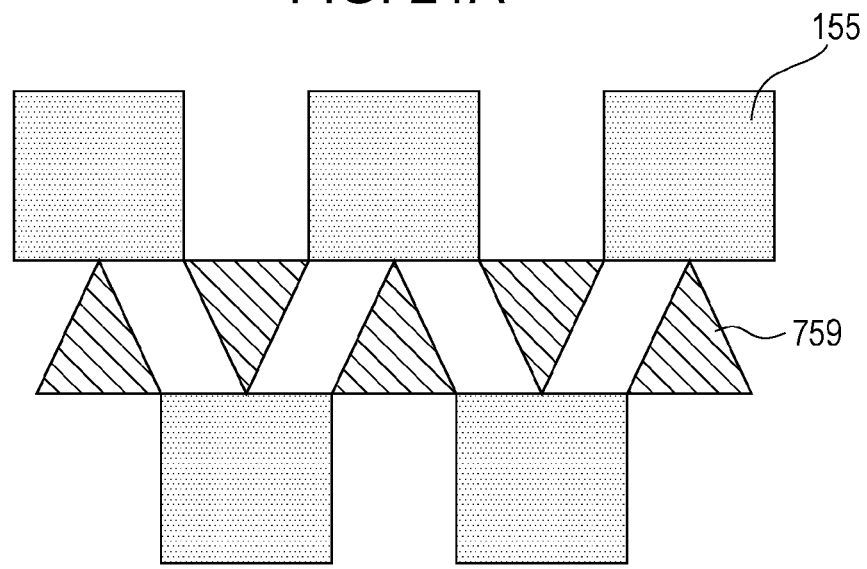
FIG. 21A is a plan view illustrating a modification of a layout of first electrodes in the semiconductor device according to the second embodiment of the present disclosure.

The modification illustrated in FIG. 21A has multiple first electrodes 759 shaped as isosceles triangles laid out between the first second-conductivity-type region group 301 and second second-conductivity-type region group 302 in a manner separated from each other. Each first electrode 759 is laid out over an isosceles triangle region defined by the points P1, P2, and P3, illustrated in FIG. 19B.

Figure 21B:
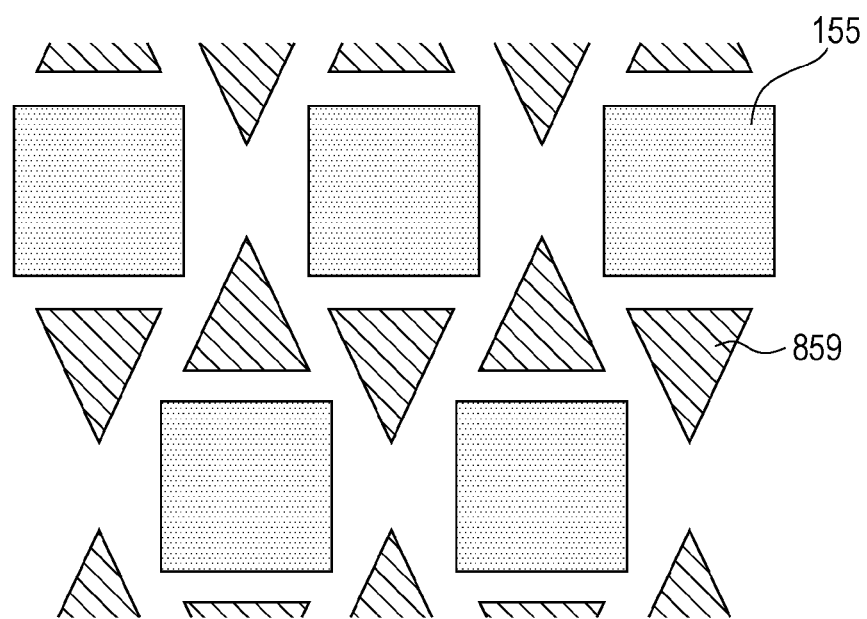
FIG. 21B is a plan view illustrating a modification of a layout of first electrodes in the semiconductor device according to the second embodiment of the present disclosure.

The modification illustrated in FIG. 21B has multiple first electrodes 859 shaped as isosceles triangles laid out between the first second-conductivity-type region group 301 and second second-conductivity-type region group 302 in a manner separated from each other. The layout of the first electrodes 859 in the modification illustrated in FIG. 21B is that where the orientations of the first electrodes 759 in FIG. 21A have been inverted between the first second-conductivity-type region group 301 and the second second-conductivity-type region group 302.

Figure 22A:
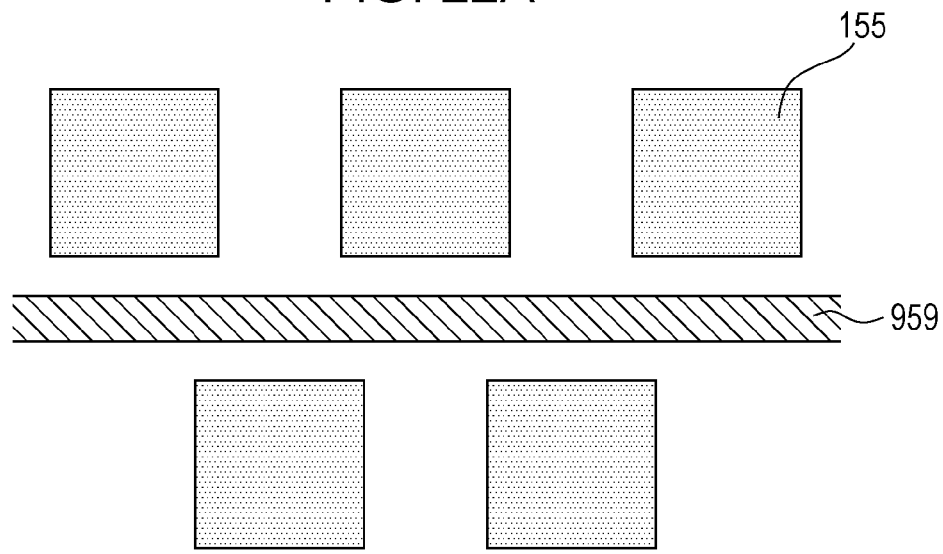
FIG. 22A is a plan view illustrating a modification of a layout of first electrodes in the semiconductor device according to the second embodiment of the present disclosure.

The modification illustrated in FIG. 22A has a stripe-shaped first electrode 959 situated between the first second-conductivity-type region group 301 and second second-conductivity-type region group 302, and separated from the first second-conductivity-type region group 301 and second second-conductivity-type region group 302.

Figure 22B:
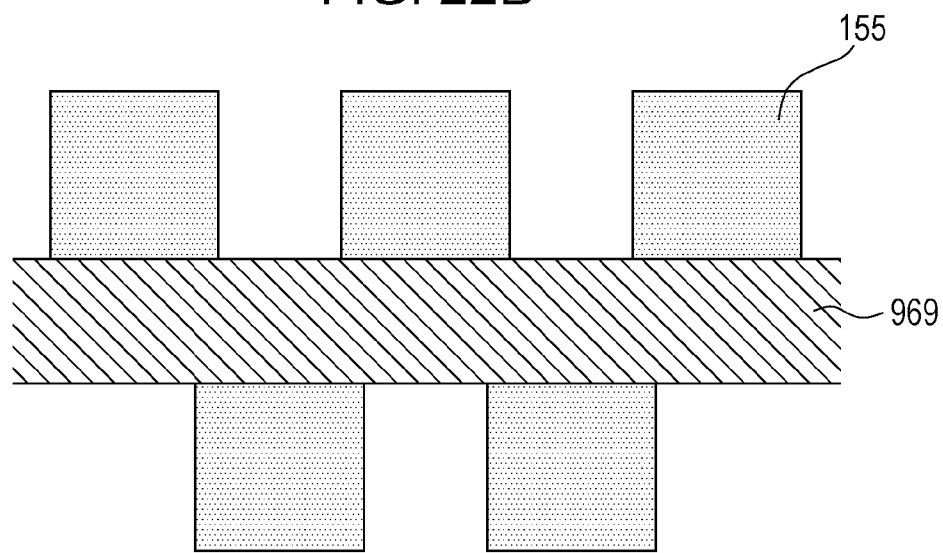
FIG. 22B is a plan view illustrating a modification of a layout of first electrodes in the semiconductor device according to the second embodiment of the present disclosure.

The modification illustrated in FIG. 22B has a stripe-shaped first electrode 969 situated between the first second-conductivity-type region group 301 and second second-conductivity-type region group 302, in contact with the first second-conductivity-type region group 301 and second second-conductivity-type region group 302 when viewed from the direction perpendicular to the principal surface 114 of the semiconductor substrate 101.

Each of the modifications in FIGS. 21A through 22B has the first electrodes laid out so as to cover at least the points Q of the regions 320 in the drift layer 102 surrounded by the first second-conductivity-type region 311, second second-conductivity-type region 312, and third second-conductivity-type region 313, when viewed from the direction perpendicular to the principal surface 114 of the semiconductor substrate 101. Accordingly, in each of the modifications in FIGS. 21A through 22B, inverse direction leak current can be effectively reduced in the same way as with the semiconductor device according to the second embodiment.

Third Embodiment

Structure of Semiconductor Device

Figure 23:
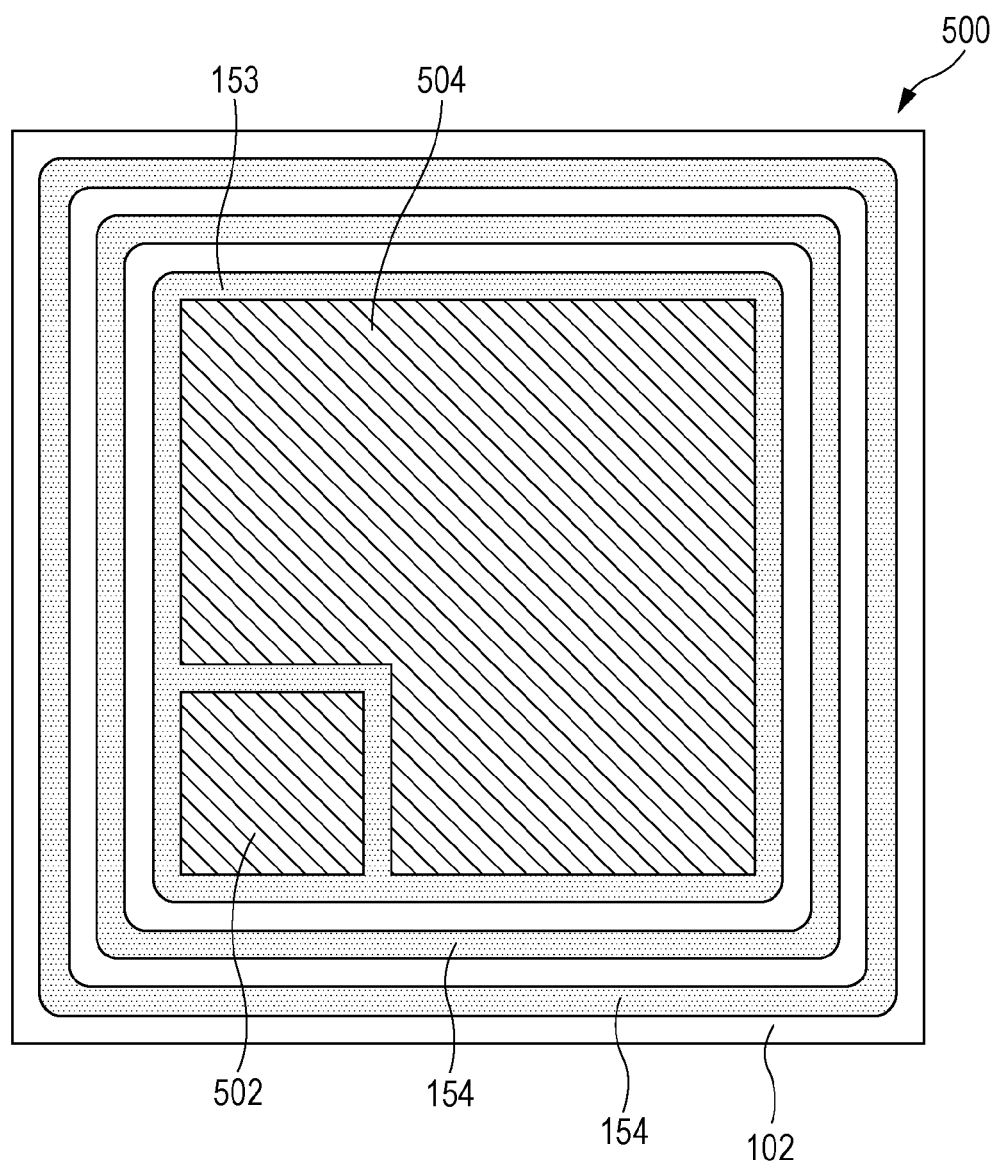
FIG. 23 is a plan view illustrating an overview of a semiconductor device according to a third embodiment of the present disclosure.
Figure 24:
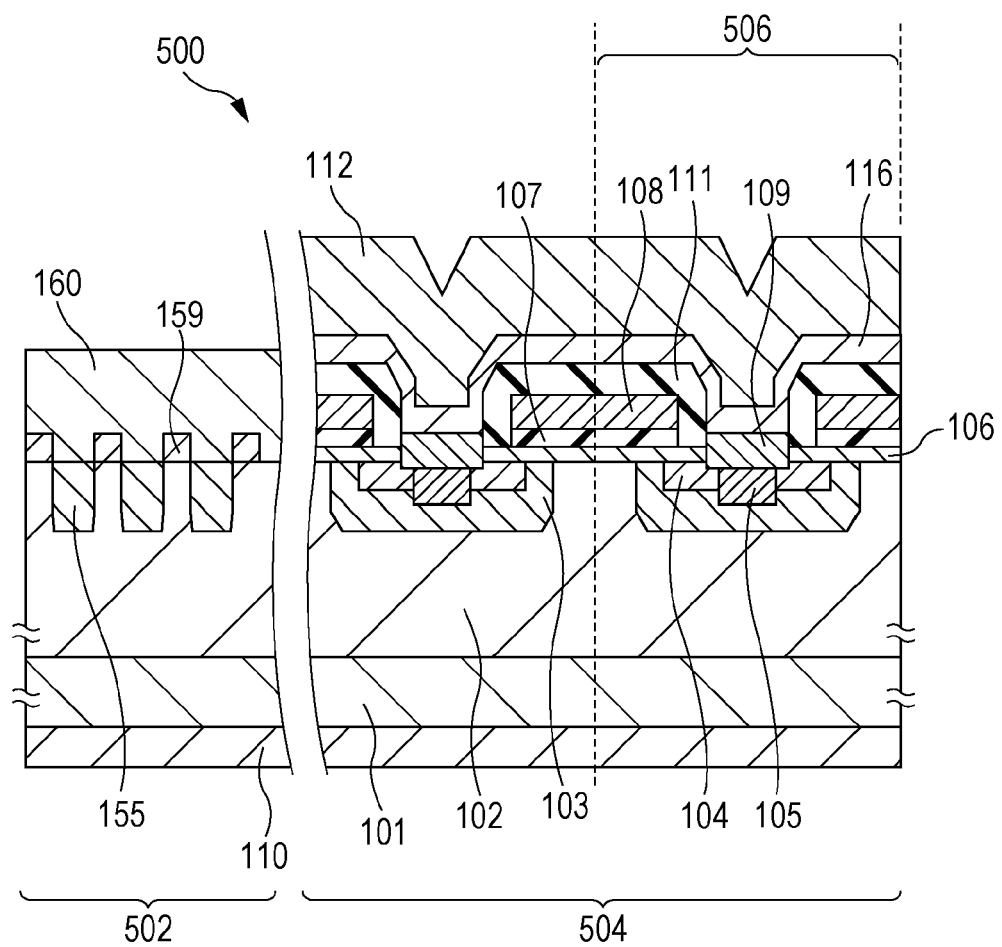
FIG. 24 is a cross-sectional view illustrating an overview of part of the semiconductor device according to the third embodiment of the present disclosure.

The structure of a semiconductor device 500 according to a third embodiment of the present disclosure will be described with reference to FIGS. 23 and 24. FIG. 23 is a plan view illustrating an overview of the semiconductor device 500 according to the present embodiment. FIG. 24 is a cross-sectional view illustrating an overview of part of the semiconductor device 500.

The semiconductor device 500 according to the present embodiment has a first semiconductor device unit 502 serving as an SBD, and a second semiconductor device unit 504 serving as an accumulation-type MISFET, on a single semiconductor substrate 101. The structure of the first semiconductor device unit 502 is the same as that of the semiconductor device 100 according to the first embodiment, so description will be omitted.

The first semiconductor device unit 502 and second semiconductor device unit 504 are situated in a region surrounded by FLR regions 154 of the semiconductor device 500 according to the present embodiment, when viewed from the direction perpendicular to the principal surface 114 of the semiconductor substrate 101, as illustrated in FIG. 23. The guard ring region 153 is disposed around the first semiconductor device unit 502 and second semiconductor device unit 504, and between the first semiconductor device unit 502 and second semiconductor device unit 504. The second semiconductor device unit 504 is configured including multiple unit cells 506, as illustrated in FIG. 24.

Although FIG. 23 illustrates where one each of a first semiconductor device unit 502 and a second semiconductor device unit 504 larger than the first semiconductor device unit 502 are laid out in a region surrounded by FLR regions 154, this is not restrictive. Multiple first semiconductor device units 502, or multiple second semiconductor device units 504, may be laid out in a region surrounded by FLR regions 154. The first semiconductor device unit 502 may be larger than the second semiconductor device unit 504.

As illustrated in FIG. 24, the second semiconductor device unit 504 has a body region 103 of a second conductivity type, disposed within the drift layer 102. A source region 104 which is an impurity region of a first conductivity type, and a contact region 105 of a second conductivity type, are disposed within the body region 103. A channel layer 106 which is a second silicon carbide semiconductor layer of a first conductivity type is disposed in contact with the source region 104, at least above the body region 103. A gate insulating film 107 is disposed above the channel layer 106, and a gate electrode 108 is disposed above the gate insulating film 107. The gate insulating film 107 is situated above at least part of the body region 103. A source electrode 109 is provided so as to electrically connect to the source region 104 and contact region 105. The source electrode 109 forms an ohmic contact with the source region 104. An interlayer insulating film 111 is disposed so as to cover the gate electrode 108. A barrier metal layer 116 is disposed on the interlayer insulating film 111 and the source electrode 109, with an upper electrode 112 disposed on the barrier metal layer 116. The upper electrode 112 is electrically connected to the source electrode 109 via the barrier metal layer 116.

The first electrodes 159 and second electrode 160 in the first semiconductor device unit 502 serve as the anode, and the third electrode 110 serves as the cathode. On the other hand, the upper electrode 112 and source electrode 109 in the second semiconductor device unit 504 serve as the source, the third electrode 110 serves as the drain, and the gate electrode 108 serves as the gate. Accordingly, the first semiconductor device unit 502 serving as a diode and the second semiconductor device unit 504 serving as a transistor are connected in parallel in the semiconductor device 500. The semiconductor device 500 can be used as a reflux diode and semiconductor switch making up an arm in an inverter circuit, for example.

Manufacturing Method of Semiconductor Device

Next, a method of manufacturing the semiconductor device 500 according to the present embodiment will be described with reference to FIGS. 25A through 29. FIGS. 25A through 29 are cross-sectional views illustrating a part of the manufacturing method of the semiconductor device 500 according to the present embodiment.

First, a semiconductor substrate 101 is prepared. The semiconductor substrate 101 is a low-resistive n-type 4H—SiC off-cut substrate, having resistivity of, for example, around 0.02 Ω·cm. The principal surface of the SiC substrate is an off-cut face from a (0001) face, for example.

Figure 25A:
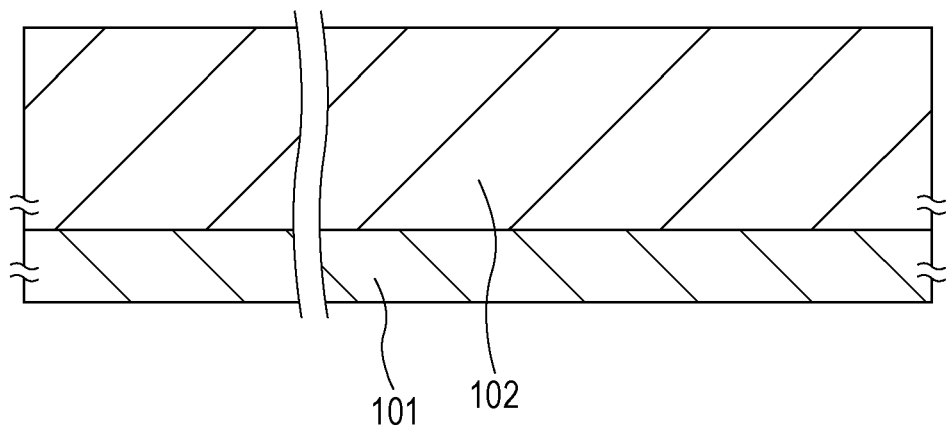
FIG. 25A is a cross-sectional view illustrating a part of a manufacturing method of the semiconductor device according to the third embodiment of the present disclosure.

A highly resistive n-type drift layer 102 is epitaxially grown on the semiconductor substrate 101, as illustrated in FIG. 25A. A buffer layer may be deposited on the semiconductor substrate 101 using n-type high-impurity-concentration SiC, before forming the drift layer 102. The impurity concentration of the buffer layer is, for example, $1 \times 10^{18}$ $cm^{-3}$, and the thickness of the buffer layer is, for example, 1 μm. The drift layer 102 is configured using, for example, n-type 4H—SiC, and the impurity concentration and thickness thereof are, for example, $1 \times 10^{16}$ $cm^{-3}$ and 10 μm, respectively.

Figure 25B:
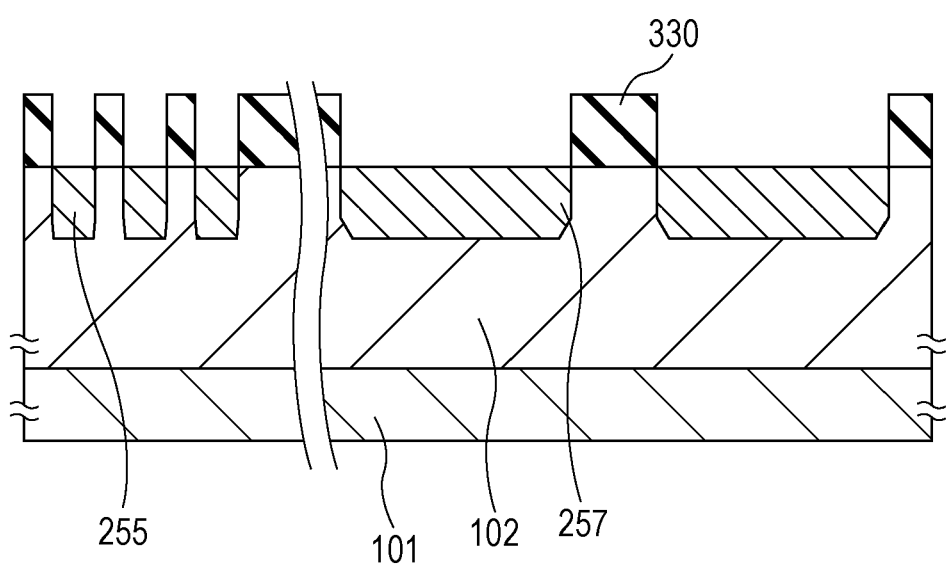
FIG. 25B is a cross-sectional view illustrating a part of a manufacturing method of the semiconductor device according to the third embodiment of the present disclosure.

Next, with reference to FIG. 25B, a mask 330 formed of $SiO_2$, for example, is formed on the drift layer 102, and thereafter, Al ions, for example, are implanted into the drift layer 102. The ion implantation energy and dose is adjusted such that the concentration of implanted Al ions is around $2 \times 10^{18}$ $cm^{-3}$, and the depth of implanted Al ions is around 0.5 to 1.0 μm, for example. The term "depth" as used here means the distance from the surface of the drift layer to a position in the drift layer where the concentration of implanted Al ions and the concentration of n-type impurities is equal. Ion implantation regions 255 and 257 formed in the process later become the p-type second-conductivity-type regions 155 and p-type body regions 103. Although omitted from illustration, ion implantation to form guard ring regions 153 and FLR regions 154 is performed as necessary at the same time as forming the ion implantation regions 255 and 257. By performing these implantations at the same time, the impurity concentration depth profiles of the guard ring regions 153, FLR regions 154, and second-conductivity-type regions 155 and body region 103 in the direction perpendicular to the principal surface of the semiconductor substrate 101 become the same.

Figure 26A:
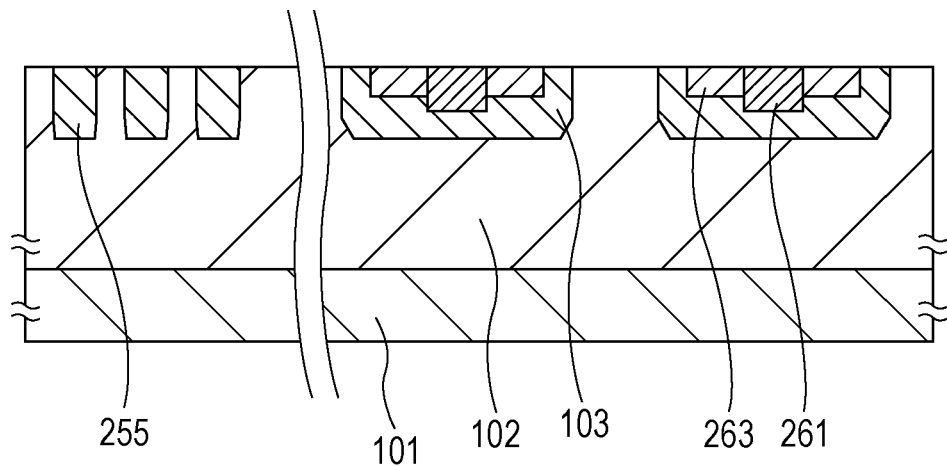
FIG. 26A is a cross-sectional view illustrating a part of a manufacturing method of the semiconductor device according to the third embodiment of the present disclosure.

Next, with reference to FIG. 26A, after removal of the mask 330, ion implantation of n-type impurities and p-type impurities using a suitable mask (omitted from illustration) forms a source implantation region 263 and contact implantation region 261 in the second semiconductor device unit 504. The depth of the source implantation region 263 is 250 nm and the average impurity concentration of the source implantation region 263 is approximately $5 \times 10^{19}$ $cm^{-3}$, for example. The depth of the contact implantation region 261 is 400 nm and the average impurity concentration of the contact implantation region 261 is approximately $1 \times 10^{20}$ $cm^{-3}$, for example.

Figure 26B:
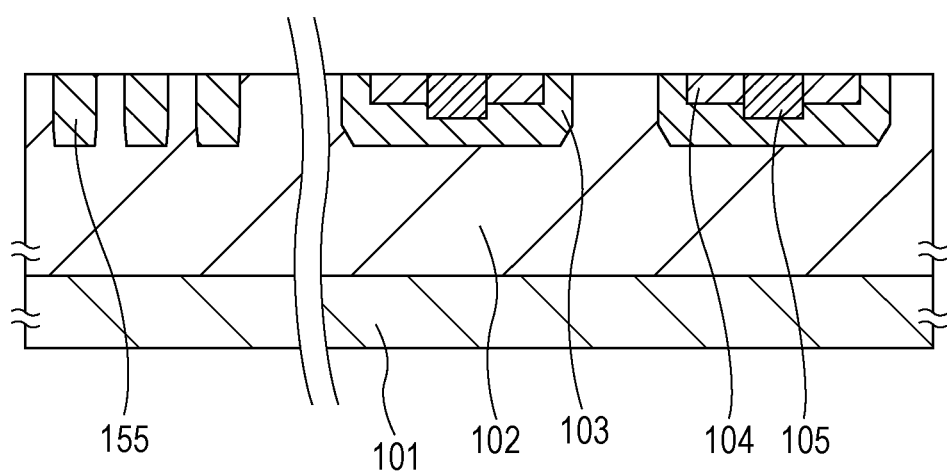
FIG. 26B is a cross-sectional view illustrating a part of a manufacturing method of the semiconductor device according to the third embodiment of the present disclosure.

Next, after removal of all masks, the article is treated by heat at a temperature of around 1500 to 1900° C., thereby forming the second-conductivity-type regions 155, body regions 103, source regions 104, and contact regions 105, as illustrated in FIG. 26B. Note that a carbon layer may be deposited on the surface of the drift layer 102 before treating with heat, and removing the carbon layer thereafter.

Figure 27A:
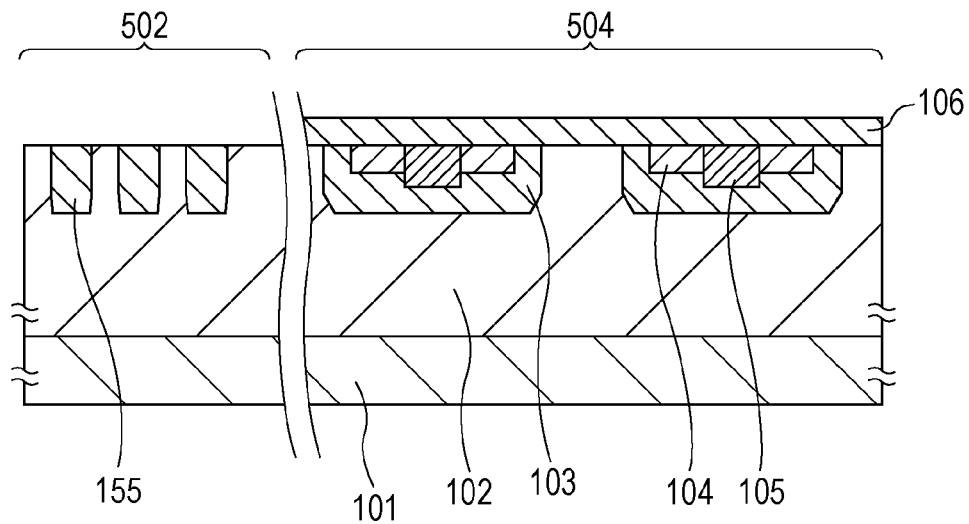
FIG. 27A is a cross-sectional view illustrating a part of a manufacturing method of the semiconductor device according to the third embodiment of the present disclosure.

Next, an n-type channel layer 106 formed of silicon carbide is epitaxially grown on the entire surface of the drift layer 102 including the second-conductivity-type regions 155, body regions 103, source regions 104, and contact regions 105, as illustrated in FIG. 27A. The dopant concentration and thickness of the channel layer 106 is adjusted such that the transistor threshold voltage is a desired value. For example, the dopant concentration of the channel layer 106 is around $1 \times 10^{16}$ $cm^{-3}$ to $5 \times 10^{18}$ $cm^{-3}$, and the thickness of the channel layer 106 is around 20 to 300 nm. The channel layer 106 is preferably formed thicker than the target thickens, assuming that the thickness will decrease in the following processes. Next, the channel layer 106 is removed by etching from at least above the first semiconductor device unit 502, so that the channel layer 106 only remains on the second semiconductor device unit 504.

Figure 27B:
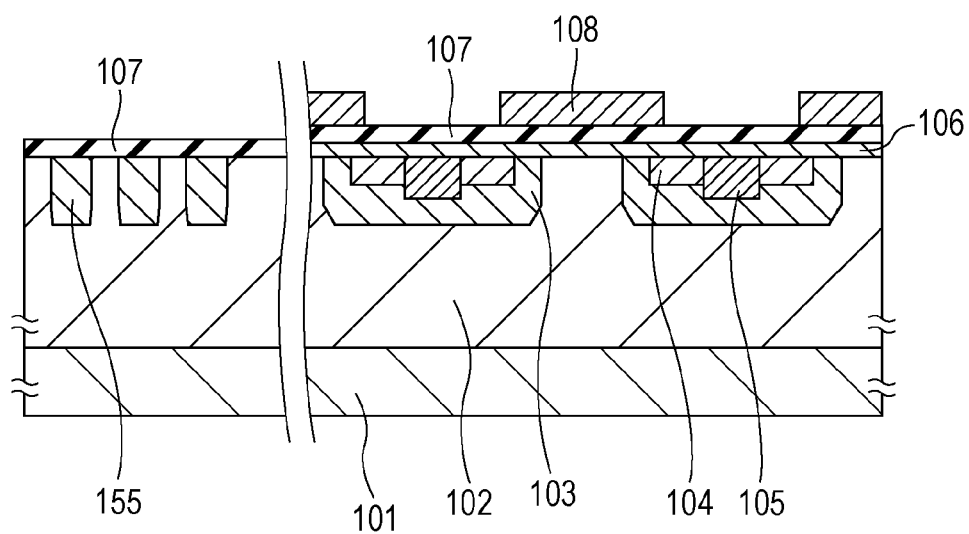
FIG. 27B is a cross-sectional view illustrating a part of a manufacturing method of the semiconductor device according to the third embodiment of the present disclosure.

Next, the gate insulating film 107 is formed on the surface of the channel layer 106 by thermal oxidation, for example, as illustrated in FIG. 27B. At this time, the surface of the first semiconductor device unit 502 is oxidized as well. Subsequently, a polycrystalline silicon film, which has been doped by phosphorous to a concentration of $7 \times 10^{20}$ cm$^{-3}$, for example, is deposited on the surface of the gate insulating film 107. The thickness of the polycrystalline silicon film, is around 500 nm, for example. The polycrystalline silicon film, is subsequently etched by dry etching using a mask (omitted from illustration), thereby forming gate electrodes 108 in desired regions.

Figure 28A:
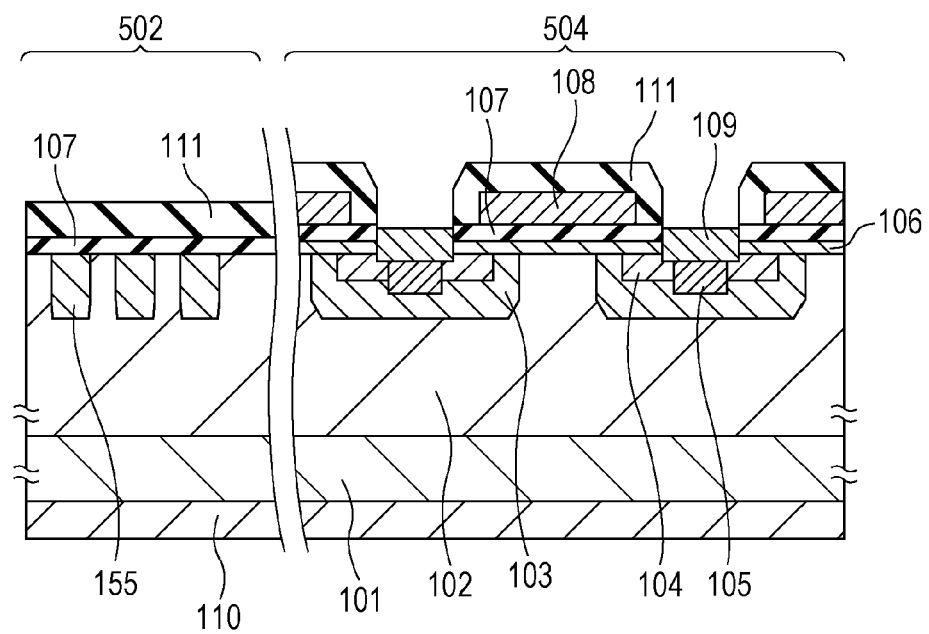
FIG. 28A is a cross-sectional view illustrating a part of a manufacturing method of the semiconductor device according to the third embodiment of the present disclosure.

Next, the interlayer insulating film 111 formed of SiO$_2$, for example, is deposited by chemical vapor deposition (CVD), so as to cover the surface of the gate electrodes 108 and gate insulating film 107, as illustrated in FIG. 28A. The thickness of the interlayer insulating film 111 is, for example, 1 µm. Next, contact holes reaching the channel layer 106 are formed in the interlayer insulating film 111 and gate insulating film 107, by dry etching using a mask (omitted from illustration). The interlayer insulating film 111 on the first semiconductor device unit 502 is covered by the mask (omitted from illustration) at this time, so that the interlayer insulating film 111 remains upon the first semiconductor device unit 502. Next, a Ni film is formed above the interlayer insulating film 111 having the contact holes to a thickness around 100 nm for example, after which thermal treatment is performed at around 950° C. in an inactive atmosphere for around 1 to 5 minutes. Accordingly, part of the channel layer 106 exposed within the contact holes and the Ni film are made to react, and thus source electrodes 109 of Ni silicide are formed. Subsequently, the unnecessary Ni film formed on the interlayer insulating film 111 is removed. Next, a Ni film for example is deposited on the entirety of the rear surface of the semiconductor substrate 101, following which the Ni film is made to react with the semiconductor substrate 101 by thermal treatment, thus forming the third electrode 110.

Figure 28B:
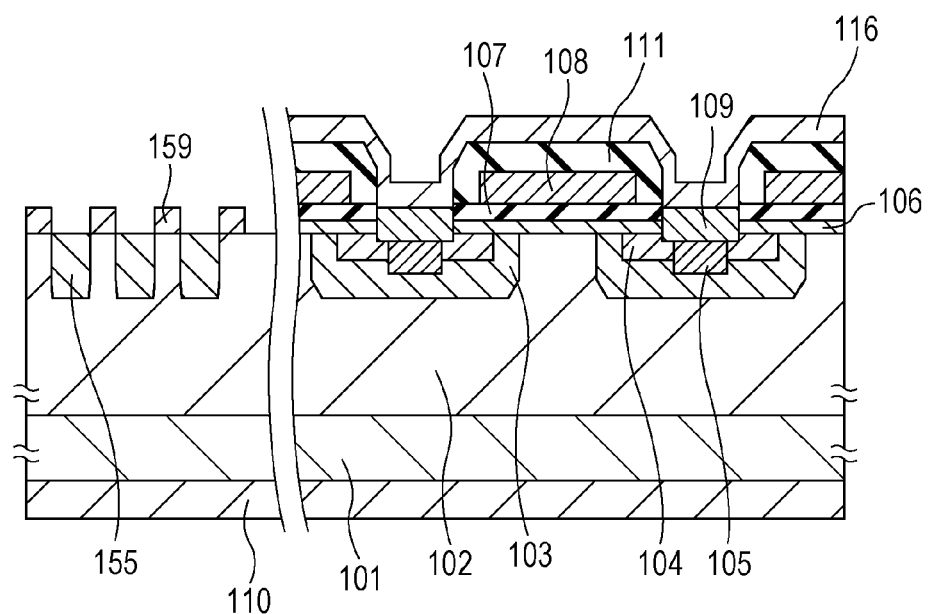
FIG. 28B is a cross-sectional view illustrating a part of a manufacturing method of the semiconductor device according to the third embodiment of the present disclosure.

Next, the interlayer insulating film 111 and gate insulating film 107 in the first semiconductor device unit 502 are selectively removed using a mask (omitted from illustration), thereby exposing the surface of the drift layer 102 in the first semiconductor device unit 502, as illustrated in FIG. 28B. Thereafter, a Ti layer is formed to around a thickness of 50 nm, for example, on the drift layer 102 in the first semiconductor device unit 502, on the interlayer insulating film 111 of the second semiconductor device unit 504, and in the contact hole. This Ti film functions as a Schottky electrode in the first semiconductor device unit 502, and functions as a barrier metal layer between the upper electrode 112 and source electrodes 109 in the second semiconductor device unit 504. A titanium nitride (TiN) film may be further formed upon the Ti film. Next, the Ti film on the first semiconductor device unit 502 is removed by etching using a mask (omitted from illustration), thereby forming the first electrodes 159. Unnecessary portions of the Ti film on the second semiconductor device unit 504 are removed by etching, thereby forming the barrier metal layer 116. Accordingly, the first electrodes 159 and the barrier metal layer 116 are formed of the same material. The patterned first electrodes 159 may be thermally treated at a temperature no lower than 100° C. and no higher than 700° C.

Figure 29:
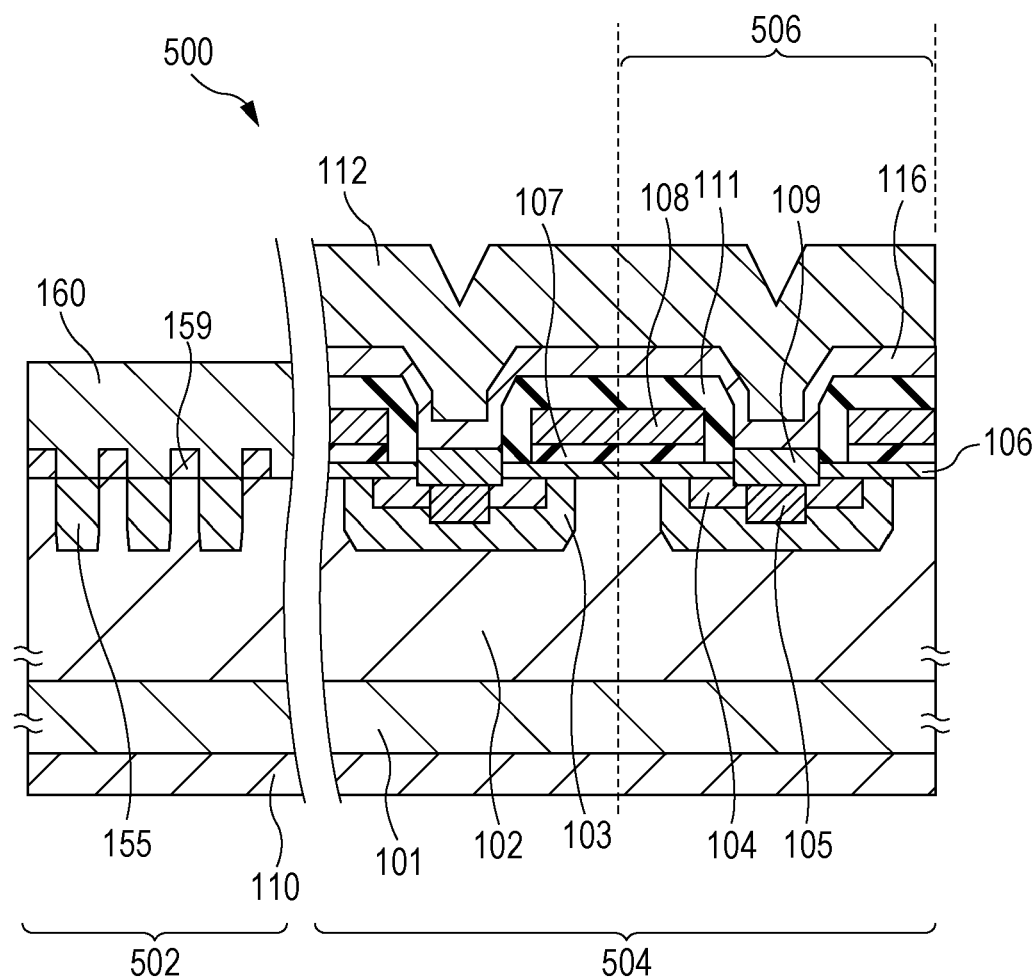
FIG. 29 is a cross-sectional view illustrating a part of a manufacturing method of the semiconductor device according to the third embodiment of the present disclosure.

Next, an Al film is deposited on the first electrodes 159 and the barrier metal layer 116 to a thickness around 3 µm, for example, after which the Al film is etched to a desired shape, thereby yielding the semiconductor device 500, as illustrated in FIG. 29. The Al film functions as the second electrode 160 in the first semiconductor device unit 502, and functions as the upper electrode 112 in the second semiconductor device unit 504.

Thereafter, a passivation film may be formed so as to cover the FLR regions 154 if necessary. Examples of the passivation film include a SiO$_2$ film, a SiN film, a polyimide film, and so forth. A metal electrode may further be formed on the third electrode 110. The metal electrode may be formed by layering Ti, Ni, and Ag, in that order from the side in contact with the third electrode 110, for example.

In the manufacturing method of the semiconductor device 500 according to the present embodiment, the first electrodes 159 and the barrier metal layer 116 are formed in the same process, and the second electrode 160 and the upper electrode 112 are formed in the same process. Accordingly, a semiconductor device 500, which has a first semiconductor device unit 502 functioning as an SBD and a second semiconductor device unit 504 functioning as a MISFET, can be fabricated with fewer processes.

Figure 30A:
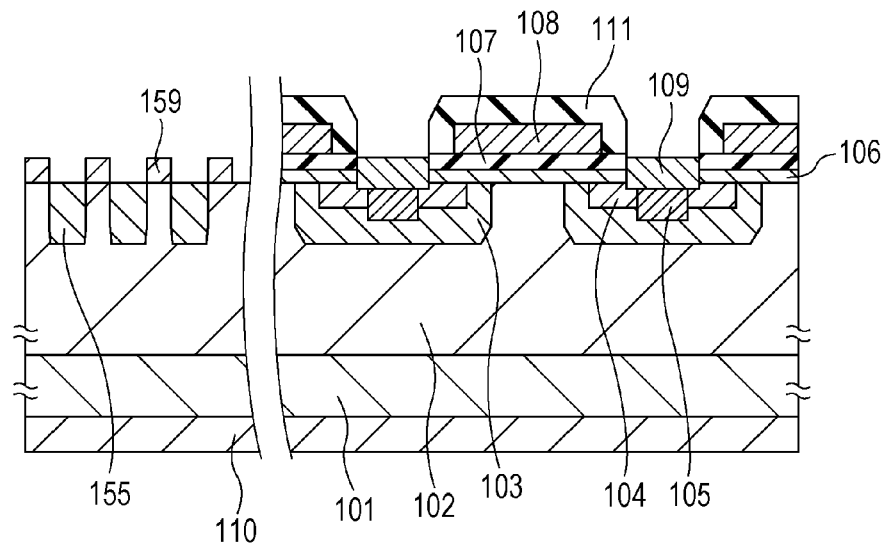
FIG. 30A is a cross-sectional view illustrating a modification of a part of a manufacturing method of the semiconductor device according to the third embodiment of the present disclosure.
Figure 30B:
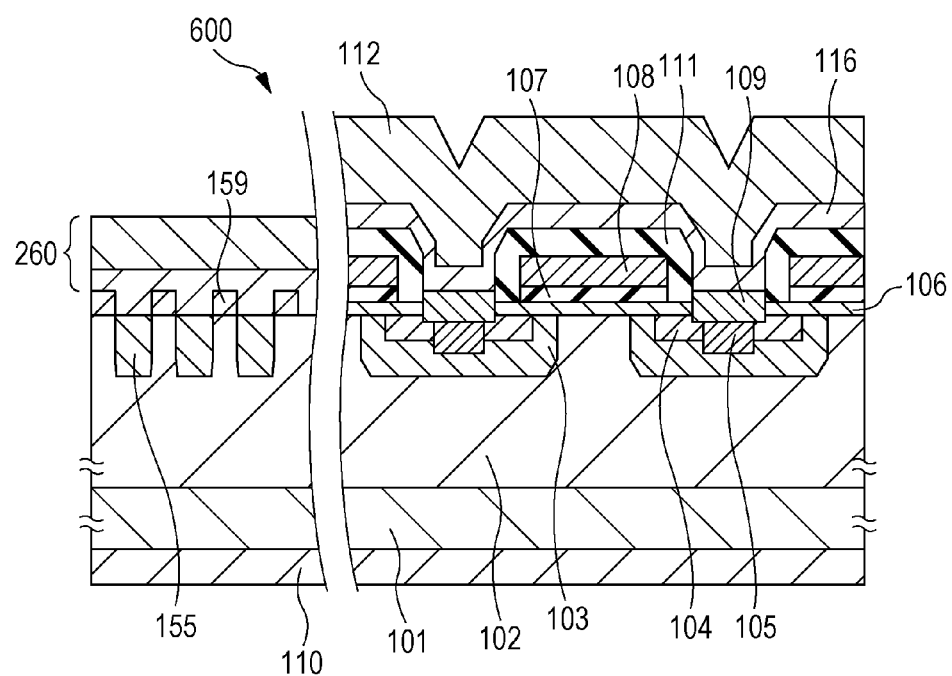
FIG. 30B is a cross-sectional view illustrating a modification of a part of a manufacturing method of the semiconductor device according to the third embodiment of the present disclosure.

Although an example has been described in the present embodiment where the first electrodes 159 and the barrier metal layer 116 are formed in the same process, and the second electrode 160 and the upper electrode 112 are formed in the same process, this is not restrictive. For example, the first electrodes 159 and the barrier metal layer 116 may be formed in separate processes, as illustrated in FIGS. 30A and 30B. In this modification, the first electrodes 159 are formed only in the first semiconductor device unit 502 after the process illustrated in FIG. 28A, as illustrated in FIG. 30A. Next, the barrier metal layer 116 and upper electrode 112 are formed in the first semiconductor device unit 502 and second semiconductor device unit 504 as illustrated in FIG. 30B, thereby yielding a semiconductor device 600. In this modification, the barrier metal layer 116 and upper electrode 112 formed in the first semiconductor device unit 502 function as a second electrode 260.

Figure 31:
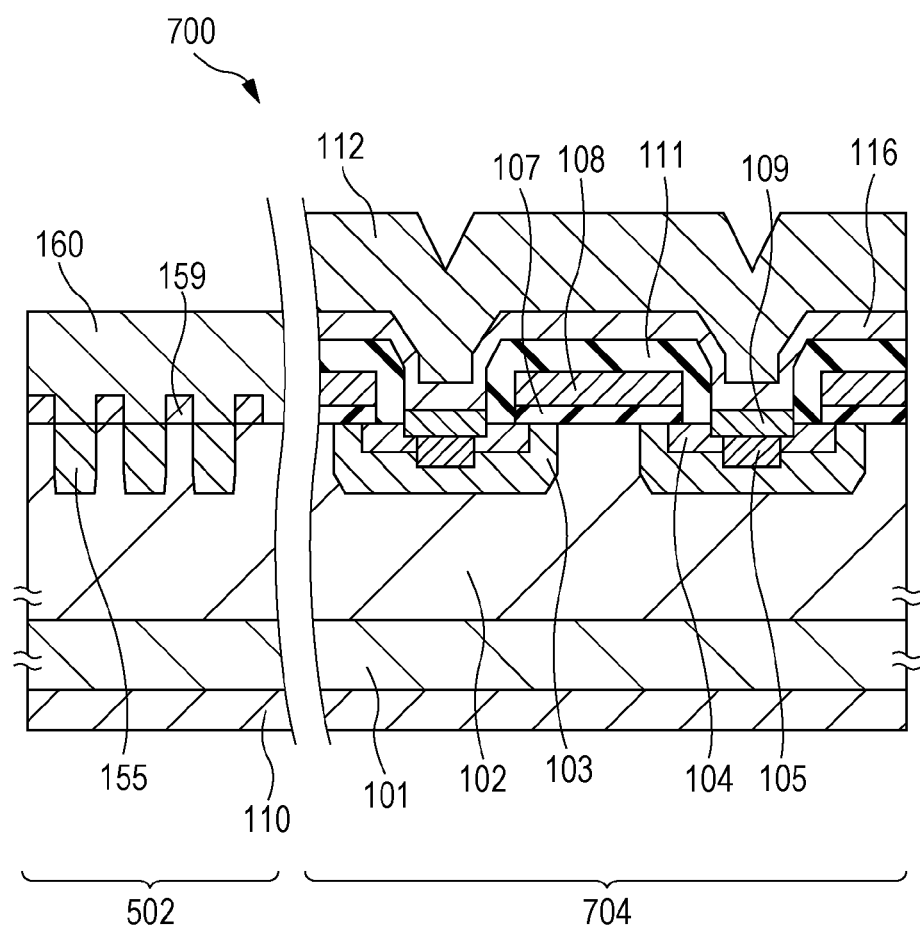
FIG. 31 is a cross-sectional view illustrating a partial overview of a modification of the semiconductor device according to the third embodiment of the present disclosure.

Although description has been made in the present embodiment regarding an example where the second semiconductor device unit 504 has the channel layer 106 and functions as an accumulation type MISFET, this is not restrictive. FIG. 31 is a cross-sectional view illustrating an overview of a part of a modification of the semiconductor device according to the present embodiment. A second semiconductor device unit 704 in a semiconductor device 700 according to the present modification does not have a channel layer as illustrated in FIG. 31, and functions as an inversion type MISFET. The gate insulating film 107 is disposed directly in contact above the body region 103 in the second semiconductor device unit 704 of the semiconductor device 700.

Figure 32:
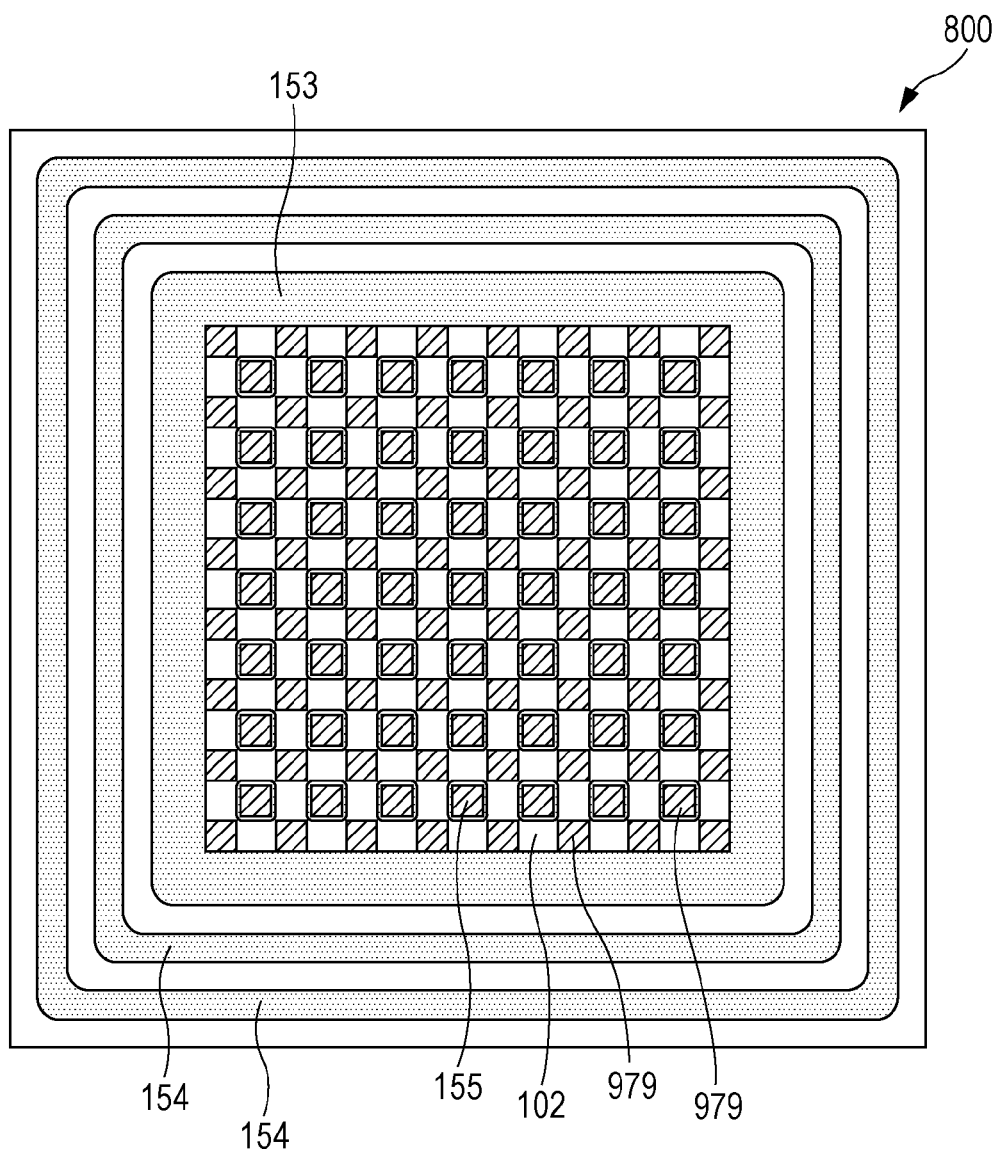
FIG. 32 is a plan view illustrating an overview of a modification of a layout of first electrodes in the semiconductor device according to the first embodiment of the present disclosure.

Although description has been made in the present embodiment regarding an example where the second electrode is disposed on the second-conductivity-type regions 155 but the first electrodes are not provided, this is not restrictive. For example, in a semiconductor device 800 illustrated in FIG. 32, first electrodes 979 may be disposed on the second-conductivity-type regions 155.

Although description has been made in the present embodiment regarding an example where Ti is used for the first electrodes and Al is used for the second electrode, this is not restrictive. For example, the metal included in the first electrode may be Ni or molybdenum (Mo), and the metal included in the second electrode may be Al. Alternatively, the metal included in the first electrode may be Ni or Mo, and the metal included in the second electrode may be Ti.

The metal included in the first electrode may be Ni, and the metal included in the second electrode may be Mo. Materials selected from a group including Ti, Ni, Al, tungsten (W), copper (Cu), cobalt (Co), Ag, gold (Au), platinum (Pt), and alloys and compounds thereof, which are materials used in semiconductor device manufacturing processes, may be used for the first electrodes and the second electrode, as long as a combination where the Schottky barrier formed between the first electrode and the drift layer 102 is larger than the Schottky barrier formed between the second electrode and the drift layer 102.

The primary component of the first electrodes and the second electrode may be of the same metal. For example, in the case of Ti, the Schottky barrier formed between the Ti and the silicon carbide can be raised by thermal treatment, as compared to a case of not performing thermal treatment. Accordingly, an arrangement may be made where Ti subjected to thermal treatment at 400 to 600° C. is used as the first electrodes, and thermally untreated Ti is used as the second electrode, for example. Alternatively, an electrode where Ti and Al have been layered in that order on the drift layer 102 may be used as the second electrode.

Although description has been made in the present embodiment regarding an example where the silicon carbide is 4H—SiC, this is not restrictive, the silicon carbide may be of another polytype, such as 6H—SiC, 3C—SiC, 15R—SiC, or the like. Although description has been made in the present embodiment regarding an example where the principal surface of the SiC substrate is an off-cut face from a (0001) face, this is not restrictive. The principal surface of the SiC substrate may be a (11-20) face, (1-100) face, (000-1) face, or an off-cut face thereof. Alternatively, the substrate may be Si, and the drift layer may be 3C—SiC. In this case, annealing to activate the impurity ions implanted to the 3C—SiC preferably is performed at or a lower temperature than the melting point of the Si substrate.

The semiconductor device according to the present disclosure is applicable to a power semiconductor device used in an on-board or industrial equipment power converter, for example.

While the present disclosure has been described with respect to preferred embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A semiconductor device comprising:
a semiconductor substrate of a first conductivity type, having a principal surface;
a first silicon carbide semiconductor layer of the first conductivity type, disposed on the principal surface of the semiconductor substrate;
a plurality of second-conductivity-type region groups each containing a plurality of second-conductivity-type regions, disposed in the first silicon carbide semiconductor layer;
a plurality of first electrodes, each of which is disposed on the first silicon carbide semiconductor layer and forms a Schottky junction with the first silicon carbide semiconductor layer, the plurality of first electrodes including a first electrode;
a second electrode that is disposed on the first silicon carbide semiconductor layer and is electrically connected with the plurality of first electrodes, and that forms a Schottky junction with the first silicon carbide semiconductor layer; and
a third electrode disposed on a rear surface of the semiconductor substrate, wherein:
the plurality of second-conductivity-type region groups include:
a first second-conductivity-type region group containing a plurality of second-conductivity-type regions that are arranged in a first direction with a space between each other, when viewed from a normal direction perpendicular to the principal surface of the semiconductor substrate; and
a second second-conductivity-type region group containing a plurality of second-conductivity-type regions that are arranged in the first direction with the space between each other, when viewed from the normal direction,
the second second-conductivity-type region group is disposed in parallel with the first second-conductivity-type region group in a second direction crossing the first direction when viewed from the normal direction,
the second electrode covers a first portion which is at least a portion of the first silicon carbide semiconductor layer between two of the second-conductivity-type regions that are adjacent and included in the first second-conductivity-type region group and the second second-conductivity-type region group, the portion being in contact with each of the two adjacent second-conductivity-type regions,
one of the two adjacent second-conductivity-type regions included in the first second-conductivity-type region group is defined as a first second-conductivity-type region and the other of the two adjacent second-conductivity-type regions included in the first second-conductivity-type region group is defined as a second second-conductivity-type region,
the second-conductivity-type region included in the second second-conductivity-type region group and adjacent to the first second-conductivity-type region and the second second-conductivity-type region is defined as a third second-conductivity-type region,
the first electrode of the plurality of first electrodes covers, of the first silicon carbide semiconductor layer in a region surrounded by the first second-conductivity-type region, the second second-conductivity-type region, and the third second-conductivity-type region, a position where a distance from the first second-conductivity-type region, a distance from the second second-conductivity-type region, and a distance from the third second-conductivity-type region are mutually equal, and
a Schottky barrier between the first electrode and the first silicon carbide semiconductor layer is larger than a Schottky barrier between the second electrode and the first silicon carbide semiconductor layer.

2. The semiconductor device according to claim 1, wherein, of the first silicon carbide semiconductor layer between the two adjacent second-conductivity-type regions included in the first second-conductivity-type region group and the second second-conductivity-type region group, an area of the first portion in contact with the second electrode is larger than an area of a second portion which is in contact with the first electrode and is a portion of the first silicon carbide semiconductor layer between the two adjacent second-conductivity-type regions.

3. The semiconductor device according to claim 1,
wherein the first electrode covers all of a third portion where a distance from the first second-conductivity-type region, a distance from the second second-conductivity-type region, and a distance from the third second-conductivity-type region, are each longer than half of the space, and the third portion is a portion of the first silicon carbide semiconductor layer in a region surrounded by the first second-conductivity-type region, the second second-conductivity-type region, and the third second-conductivity-type region.

4. The semiconductor device according to claim 1,
wherein the second second-conductivity-type region group is disposed distanced from the first second-conductivity-type region group by the space,
and the second electrode is further disposed above a fourth portion where, of the first silicon carbide semiconductor layer in a region between the first second-conductivity-type region and the third second-conductivity-type region, a distance from the first second-conductivity-type region and a distance from the third second-conductivity-type region are each half as long as the space or shorter.

5. The semiconductor device according to claim 1,
wherein the plurality of second-conductivity-type regions included in the first second-conductivity-type region group and the second second-conductivity-type region group are arrayed in a grid form when viewed from the normal direction.

6. The semiconductor device according to claim 1,
wherein the plurality of second-conductivity-type regions included in the first second-conductivity-type region group and the second second-conductivity-type region group are arrayed in a staggered form when viewed from the normal direction.

7. The semiconductor device according to claim 1,
wherein the first conductivity type is n-type,
and a work function of a metal included in the first electrode is larger than a work function of a metal included in the second electrode.

8. The semiconductor device according to claim 7,
wherein either
the metal included in the first electrode is either of nickel and molybdenum, and the metal included in the second electrode is titanium,
or
the metal included in the first electrode is selected from the group consisting of titanium, nickel, and molybdenum, and the metal included in the second electrode is aluminum.

9. The semiconductor device according to claim 1,
wherein the first electrode and the second electrode include a same element.

10. The semiconductor device according to claim 1, further comprising:
a body region of the second conductivity type, disposed in the first silicon carbide semiconductor layer;
an impurity region of the first conductivity type, disposed in the body region;
a gate insulating film disposed on the body region;
a gate electrode disposed on the gate insulating film; and
a source electrode electrically connected to the impurity region,
wherein the second electrode and the source electrode are electrically connected.

11. The semiconductor device according to claim 10, further comprising:
a second silicon carbide semiconductor layer of the first conductivity type, disposed at least between the body region and the gate insulating film.

12. The semiconductor device according to claim 10, further comprising:
an upper electrode disposed above the source electrode, and electrically connected to the source electrode,
wherein the upper electrode and the second electrode are formed of a same material.

13. The semiconductor device according to claim 10, further comprising:
a barrier metal layer disposed above the source electrode, and electrically connected to the source electrode; and
an upper electrode disposed above the barrier metal layer, and electrically connected to the barrier metal layer,
wherein the barrier metal layer and the first electrode are formed of a same material.

14. The semiconductor device according to claim 13,
wherein the upper electrode and the second electrode are formed of a same material.

15. The semiconductor device according to claim 1, wherein the first electrode partially overlaps with the first, second and third second-conductivity-type regions, when viewed from the normal direction.

16. A semiconductor device comprising:
a semiconductor substrate of a first conductivity type, having a principal surface;
a first silicon carbide semiconductor layer of the first conductivity type, disposed on the principal surface of the semiconductor substrate;
a plurality of second-conductivity-type regions disposed as a matrix in the first silicon carbide semiconductor layer;
a plurality of first electrodes, each of which is disposed on the first silicon carbide semiconductor layer and forms a Schottky junction with the first silicon carbide semiconductor layer;
a second electrode that is disposed on the first silicon carbide semiconductor layer and is electrically connected with the plurality of first electrodes, and that forms a Schottky junction with the first silicon carbide semiconductor layer; and
a third electrode disposed on a rear surface of the semiconductor substrate, wherein:
a point having an equal distance from adjacent three second-conductivity-type regions is covered by one of the plurality of first electrodes,
the second electrode is in contact with a region of the first silicon carbide semiconductor layer between the second-conductivity-type regions, and
a Schottky barrier between the first electrode and the first silicon carbide semiconductor layer is larger than a Schottky barrier between the second electrode and the first silicon carbide semiconductor layer.

17. A semiconductor device comprising:
a semiconductor substrate of a first conductivity type, having a principal surface;
a first silicon carbide semiconductor layer of the first conductivity type, disposed on the principal surface of the semiconductor substrate;
a plurality of second-conductivity-type region groups each containing a plurality of second-conductivity-type regions, disposed in the first silicon carbide semiconductor layer;
a first electrode that is disposed on the first silicon carbide semiconductor layer and forms a Schottky junction with the first silicon carbide semiconductor layer;

a second electrode that is disposed on the first silicon carbide semiconductor layer and is electrically connected with the first electrode, and that forms a Schottky junction with the first silicon carbide semiconductor layer; and a third electrode disposed on a rear surface of the semiconductor substrate, wherein: the plurality of second-conductivity-type region groups include:

a first second-conductivity-type region group containing a plurality of second-conductivity-type regions that are arranged in a first direction with a space between each other, when viewed from a normal direction perpendicular to the principal surface of the semiconductor substrate; and a second second-conductivity-type region group containing a plurality of second-conductivity-type regions that are arranged in the first direction with the space between each other, when viewed from the normal direction, the second second-conductivity-type region group is disposed in parallel with the first second-conductivity-type region group in a second direction crossing the first direction when viewed from the normal direction, and is shifted by a half of the space in the first direction, the first electrode is disposed on a line having an equal distance from the first and second second-conductivity-type region groups, when viewed from the normal direction, and a Schottky barrier between the first electrode and the first silicon carbide semiconductor layer is larger than a Schottky barrier between the second electrode and the first silicon carbide semiconductor layer.

* * * * *